United States Patent [19]
Ishikawa et al.

[11] Patent Number: 6,148,221
[45] Date of Patent: Nov. 14, 2000

[54] THIN FILM MULTILAYERED ELECTRODE OF HIGH FREQUENCY ELECTROMAGNETIC FIELD COUPLING

[75] Inventors: Youhei Ishikawa, Kyoto; Seiji Hidaka, Nagaokakyo, both of Japan

[73] Assignee: Murata Manufacturing Co., Ltd., Japan

[21] Appl. No.: 08/604,952

[22] PCT Filed: Mar. 7, 1994

[86] PCT No.: PCT/JP94/00357

§ 371 Date: Feb. 27, 1996

§ 102(e) Date: Feb. 27, 1996

[87] PCT Pub. No.: WO95/06336

PCT Pub. Date: Mar. 2, 1995

[30] Foreign Application Priority Data

Aug. 27, 1993 [JP] Japan .................................. P5-212630

[51] Int. Cl.[7] .............................. H01P 3/08; H01P 1/201; H01P 3/12
[52] U.S. Cl. .................... 505/210; 333/99.005; 333/219; 333/204; 333/239; 333/243; 333/202; 333/238
[58] Field of Search .................................... 333/995, 238, 333/246, 4, 241, 204; 505/210, 700, 701, 866

[56] References Cited

U.S. PATENT DOCUMENTS

| | | | |
|---|---|---|---|
| 2,676,309 | 4/1954 | Armstrong | 333/238 |
| 2,769,148 | 10/1956 | Clogston . | |
| 2,769,149 | 10/1956 | Kreer, Jr. . | |
| 2,777,896 | 1/1957 | Black . | |
| 2,797,393 | 6/1957 | Clogston . | |
| 2,825,759 | 3/1958 | Clogston . | |
| 2,825,760 | 3/1958 | Clogston . | |
| 2,825,761 | 3/1958 | Kreer, Jr. . | |
| 2,825,762 | 3/1958 | Kreer, Jr. . | |
| 2,831,921 | 4/1958 | Morgan, Jr. . | |
| 2,841,792 | 7/1958 | Edson et al. . | |
| 3,191,055 | 6/1965 | Swihart et al. | 333/238 X |
| 4,521,755 | 6/1985 | Carlson et al. | 333/238 X |
| 4,812,792 | 3/1989 | Leibowitz | 333/238 M |
| 5,408,053 | 4/1995 | Young | 333/328 X |

FOREIGN PATENT DOCUMENTS

| | | |
|---|---|---|
| 2105011 | 4/1972 | France . |
| 28-3635 | 7/1953 | Japan . |
| 30-1787 | 3/1955 | Japan . |

(List continued on next page.)

OTHER PUBLICATIONS

"Review of Electronic Technology—Dielectric Resonators in VHF Microelectronics", N, TsNII, Elektronika, 1981.

"Handbook of Elements of Wave Technology—Chapter 8 Filters With Quarter–Wave Connections", A.L. Feldshtein et al., M.C. Radio, 1967.

H. Blennemann et al.; "Novel Microstructures for Low–Distortion Chip–to–Chip Interconnects", pp. 225–226, and 232.

*Primary Examiner*—Benny Lee
*Attorney, Agent, or Firm*—Ostrolenk, Faber, Gerb & Soffen, LLP

[57] ABSTRACT

A plurality of TEM mode transmission lines (L2–L5) are structured by pairs of thin film conductors (21 and 22, 22 and 23, 23 and 24, and 24 and 25) which sandwich thin film dielectrics (31 to 34) by alternately stacking the thin film conductor (21 to 25) and the thin film dielectric (31 to 34). The phase velocities of TEM mode waves which are propagated at least by two of the transmission lines (L2 to L5) are substantially equal to each other. The thickness of each of the thin film conductors (21 to 25) is smaller than the skin depth of the frequency used so that the electromagnetic fields of at least two TEM mode transmission lines among the TEM mode transmission lines (L2 to L5) are coupled to each other. In this way, the skin depth can be increased effectively. The conductor loss and the surface resistance can be reduced significantly as compared to those of the conventional electrode. By use of this electrode, a transmission line, a resonator, a filter, and a high frequency device are structured.

20 Claims, 25 Drawing Sheets

FOREIGN PATENT DOCUMENTS

| | | |
|---|---|---|
| 30-4632 | 7/1955 | Japan . |
| 51-138881 | 11/1976 | Japan . |
| 28844 | 1/1989 | Japan ..................................... 505/704 |
| 443703 | 2/1992 | Japan . |
| 5085705 | 4/1993 | Japan ..................................... 505/701 |

Flow for determining minimized surface resistance

THIN FILM MULTILAYERED ELECTRODE OF HIGH FREQUENCY ELECTROMAGNETIC FIELD COUPLING

TECHNICAL FIELD

The present invention relates to a high frequency electromagnetic field coupled type thin film multilayered electrode used in high frequency bands of microwaves, semi-millimeter waves, or millimeter waves, and relates to a high frequency transmission line using the thin film multilayered electrode, a high frequency resonator using the thin film multilayered transmission line, a high frequency filter comprising the high frequency resonator, and a high frequency device comprising the thin film multilayered electrode.

BACKGROUND ART

In recent years the reduction in size of electronic components has been implemented by using high dielectric materials even in high frequency bands of microwaves, semi-millimeter waves, or millimeter waves. For implementation of downsizing of a device, when the shape of the device is reduced into a similar shape while the dielectric constant thereof is increased, there is such a problem that in principle, an energy loss increase in inverse proportion to the cube root of its volume.

The energy loss of high frequency devices can be classified roughly into a conductor loss due to the skin effect and a dielectric loss due to the dielectric material thereof. Dielectric materials that have been developed into practical use in recent years include those having a low loss characteristic even when they have their high dielectric constant, and therefore, the conductor loss rather than dielectric loss is predominant in the no-loaded Q of their circuits. As shown in FIG. 11, a high frequency current concentrates on the conductor surface due to the skin effect, so that the closer to the conductor surface the position is, the more the surface resistance (also referred to as a skin resistance) increases, and this leads to an increased conductor loss (Joule loss).

In view of these circumstances, an improved symmetrical strip line resonator (hereinafter, referred to as a conventional resonator) which is effectively reduced in conductor loss enough to obtain a high no-loaded Q has been proposed in the Japanese Patent Laid-Open Publication No. HEISEI 4 (1992)-43703. The conventional resonator is a symmetrical strip line resonator in which a resonator circuit is made up of symmetrical strip lines having a strip conductor disposed between a pair of earth conductors which are oppositely positioned a predetermined distance away from each other with a dielectric interposed therebetween, wherein the symmetrical strip line resonator is characterized in that a plurality of sheets of strip conductors is disposed between the pair of earth conductors in parallel to the pair of earth conductors so that the plurality of sheets of strip conductors are multilayered so as to be spaced from each other at a predetermined interval with the dielectric interposed therebetween.

The publication which discloses the above-mentioned conventional resonator also discloses the followings:

(a) it is preferably that the respective strip conductors are formed so as to have a thickness three times as thick as or more than the skin depth in order to effectively suppress the conductor loss; that is, in the strip conductors, the skin portion through which a high frequency current of microwave band flows is increased so that the effective sectional area in the strip conductors is increased;

(b) a pair of strip conductors are made to conduct with each other at ends thereof via a through hole while they are made to conduct with each other also at another end via a through hole; and (c) an electric field distribution of the resonator is formed so that the electric field is directed from each of the strip conductors toward the earth conductors.

However, since it has the above-mentioned structure (a), there is such a problem that it is difficult to reduce the size and weight thereof, and the resonator has a relatively small reduction rate in conductor loss as well as a relatively small no-loaded Q.

Accordingly, the object of the present invention is to solve the above-mentioned problems, and is to provide a high frequency electrode which can remarkably reduce the conductor loss as compared with that of the conventional counterpart, and yet which can reduce the size and the weight of the embodied product of the present invention, and to provide a high frequency transmission line, a high frequency resonator, a high frequency filter, and a high frequency device.

SUMMARY OF THE INVENTION

The present inventor provides a high frequency electromagnetic field coupled type thin film multilayered electrode, a thin film multilayered transmission line and the like, capable of remarkably reducing the conductor loss by suppressing the skin effect with a structure completely different from that of the conventional resonator, i.e., with a thin film multilayered electrode formed by alternately stacking a thin film conductor and a thin film dielectric, each thin film conductor having a film thickness smaller than a skin depth δo of a frequency which is used.

A high frequency electromagnetic field coupled type thin film multilayered electrode according to the present invention is a thin film multilayered electrode in which:

thin film conductors and thin film dielectrics are alternately stacked so that a plurality of TEM mode transmission lines are multilayered, each of the TEM mode transmission lines comprising a pair of the thin film conductors between which each of the thin film dielectrics is sandwiched, wherein, based on a number (n) of multilayered layers of said thin film conductors and the thin film dielectrics, a film thickness of each of the thin film dielectrics is set so that phase velocities of TEM waves which propagate through at least two of the plurality of TEM mode transmission lines are made substantially equal to each other, and wherein, based on the number (n) of multilayered layers of said thin film conductors and the thin film dielectrics, a film thickness of each of the thin film conductors is made smaller than a skin depth of a frequency which is used so that electromagnetic fields of at least two of the plurality of TEM mode transmission lines are coupled with each other. In this case, each of the thin film conductors is preferably made of a superconducting material.

Further, a high frequency transmission line according to the present invention is a high frequency transmission line having at least one conductor, the conductor comprising a thin film multilayered electrode in which thin film conductors and thin film dielectrics are alternately stacked so that a plurality of TEM mode transmission lines are multilayered, each of the TEM mode transmission lines comprising a pair of the thin film conductors between which each of the thin film dielectrics is sandwiched, wherein, based on a number (n) of multilayered layers of the thin film conductors and the thin film dielectrics, a film thickness of each of the thin film dielectrics is set so that phase velocities of TEM waves of TEM waves which propagate through at least two of the plurality of TEM mode transmission lines are made substantially equal to each other, and wherein, based on the number (n) of multilayered layers of said thin film conductors and the thin film dielectrics, a film thickness of each of the thin film conductors is made smaller than a skin depth of a frequency which is used so that electromagnetic fields of at least two of the plurality of TEM mode transmission lines are coupled with each other. In this case, the high frequency transmission line is implemented by, for example, a waveguide.

Further, a high frequency transmission line according to the present invention is a high frequency transmission line comprising:

a first transmission line; and at least one TEM mode second transmission line in which a thin film conductor and a thin film dielectric are alternately stacked so that the velocity of an electromagnetic wave which propagates through the first transmission line (L1) and a phase velocity of a TEM wave which propagates through at least one of the second transmission line (L2–L5) are made substantially equal to each other, and wherein, based on the number (n) of multilayered layers of said thin film conductors (21–25) and said thin film dielectrics (31–34), a film thickness of the thin film conductors (21–25) is made smaller than a skin depth of a frequency which is used so that an electromagnetic field of the first transmission line (L1) and an electromagnetic field of at least one of the second transmission line (L2–L5) are coupled with each other.

A high frequency resonator according to the present invention includes the above-mentioned high frequency transmission line having predetermined dimensions. In this case, the high frequency transmission line preferably has a length equal to a quarter of a guide wavelength of a signal transmitted through the high frequency transmission line, in a direction in which the signal is transmitted.

Yet further, in the high frequency device, the electrode includes the above-mentioned high frequency electromagnetic field coupled type thin film multilayered electrode, thereby constituting a high frequency device having an extremely small conductor loss.

BRIEF DESCRIPTION OF THE DRAWINGS

FIG. 20 shows various kinds of microwave lines and waveguides using an electromagnetic field coupled type thin film multilayered electrode according to the present invention, wherein FIG. 20(a) is a perspective view of a microstrip line using an electromagnetic field coupled type thin film multilayered electrode according to the present invention; FIG. 20(b) is a perspective view of a strip line using an electromagnetic field coupled type thin film multilayered electrode according to the present invention; FIG. 20(c) is a perspective view of a coaxial line using an electromagnetic field coupled type thin film multilayered electrode according to the present invention; and FIG. 20(d) is a longitudinal sectional view of a $TM_{01}$ mode circular waveguide using an electromagnetic field coupled type thin film multilayered electrode according to the present invention.

BEST MODE FOR CARRYING OUT THE INVENTION

Figure 1:
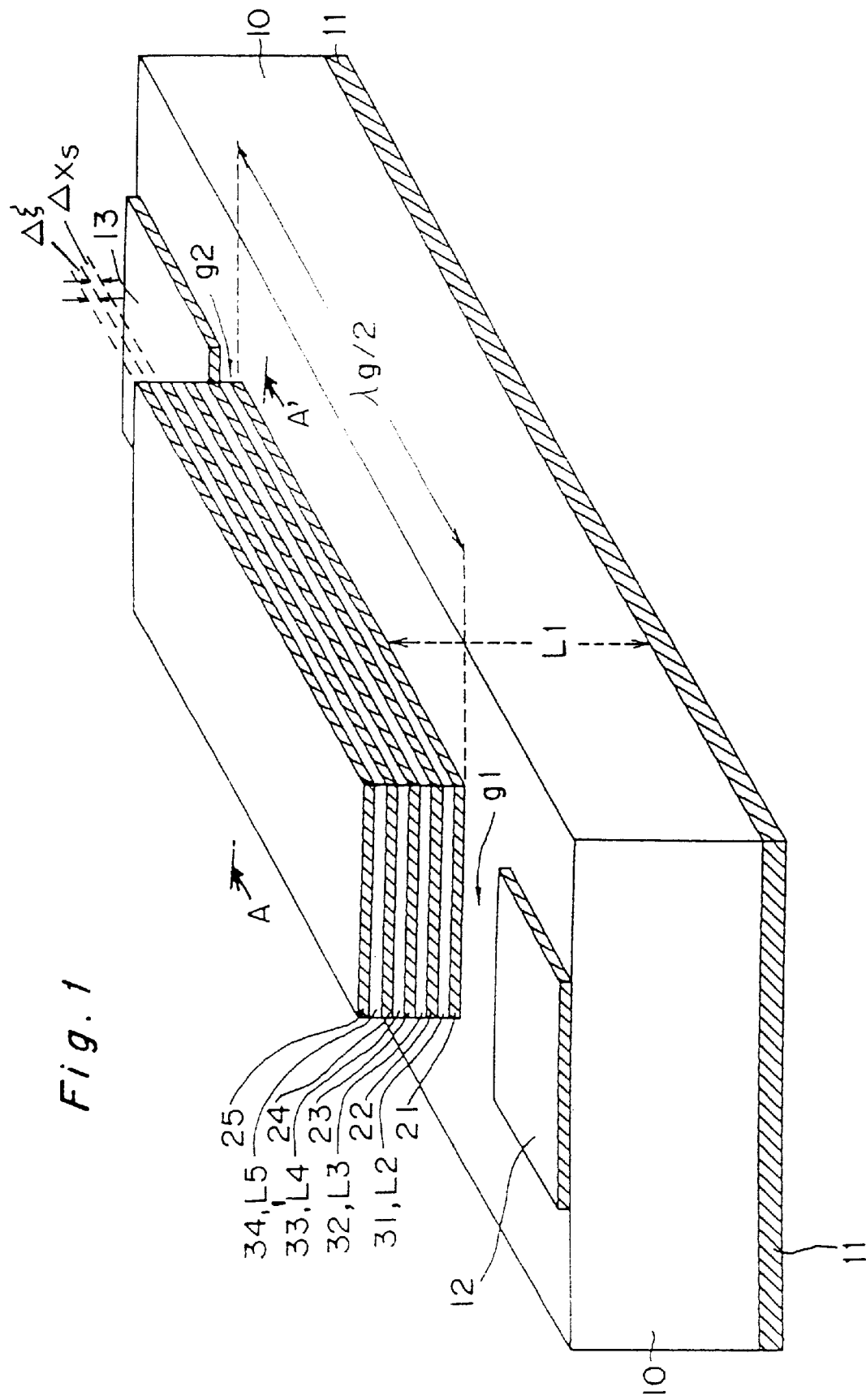
FIG. 1 is a perspective view of a filter using a half-wavelength line type resonator using an electromagnetic field coupled type thin film multilayered transmission line which is a first embodiment according to the present invention.

Embodiments of the present invention will be hereinafter described with reference to the accompanying drawings. It is noted that the same components are denoted by the same reference numerals in the accompanying drawings.

First Embodiment

Figure 2:
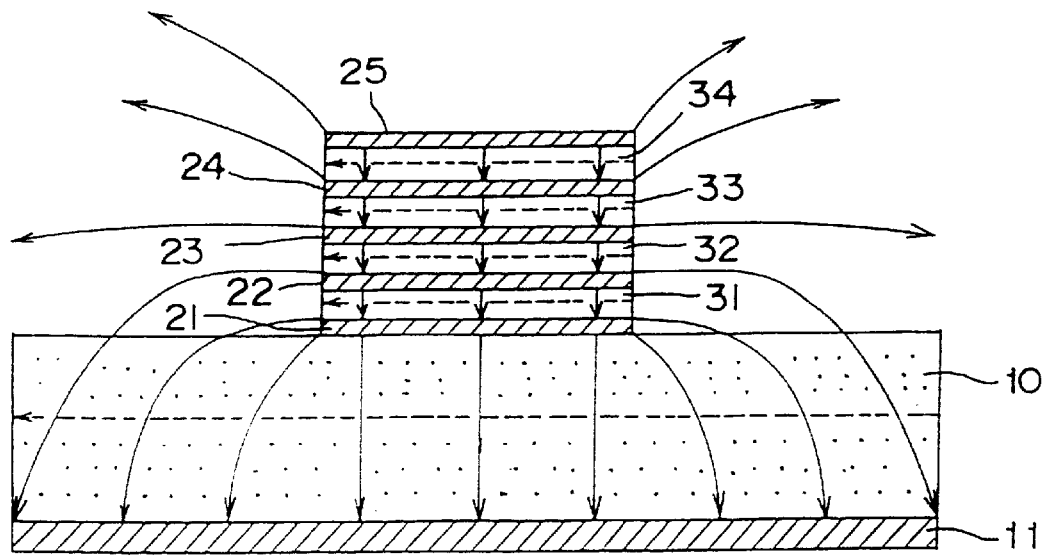
FIG. 2 is a longitudinal sectional view taken along a line A–A' of the half-wavelength line type resonator of FIG. 1.

FIG. 1 is a perspective view of a filter using a half-wavelength line type resonator using an electromagnetic field coupled type thin film multilayered transmission line which is a first embodiment according to the present invention, and FIG. 2 is a longitudinal sectional view of the half-wavelength line type resonator of FIG. 1 taken along a line A–A'.

The half-wavelength line type resonator of the first embodiment is characterized in using an electromagnetic field coupled type thin film multilayered transmission line using an electromagnetic field coupled type thin film multilayered electrode according to the present invention, which has a structure that thin film conductors 21, 22, 23, 24 and 25 and thin film dielectrics 31, 32, 33 and 34 are alternately stacked or multilayered. In the electromagnetic field coupled type thin film multilayered transmission line, a TEM mode microstrip line (hereinafter, referred to as a main transmission line) L1 is made up of a thin film conductor 21, an earth conductor 11, and a dielectric substrate 10 sandwiched between the thin film conductor 21 and the earth conductor 11, while tour TEM mode microstrip lines (hereinafter, referred to as sub-transmission lines) L2, L3, L4 and L5 (FIG. 1) are stacked or multilayered on the main transmission line L1, each sub-transmission line being made up in such a way that one thin film dielectric is sandwiched between a pair of thin film conductors. In FIG. 1 and the following drawings, reference numerals for the transmission lines are added behind "," (comma) to reference numerals of the dielectrics.

More specifically, the half-wavelength line type resonator is characterized in that:

(a) a film thickness $\Delta x_s$ and a dielectric constant $\Delta_s$ of each of the thin film dielectrics are set to predetermined values, respectively, so that the phase velocities of TEM waves which propagate through the respective transmission lines L1 to L5 are made substantially equal to each other; and (b) a film thickness $\Delta\delta$ of each of the thin film conductors 21 to 25 is set to predetermined film thicknesses smaller than the skin depth $\delta o$ of a frequency used, so that between the adjacent transmission lines L1 and L2, L2 and L3, L3 and L4, and L4 and L5, their electromagnetic fields are coupled with each other. By this arrangement, high frequency energy flowing through the main transmission line L1 is transferred to the sub-transmission lines L2 to L5, so that a high frequency current substantially uniformly flows through the respective thin film conductors 21 to 25, and this leads to that the skin effect due to the high frequency is remarkably suppressed.

As shown in FIG. 1, on the dielectric substrate 10 having the earth conductor 11 formed over its entire rear surface, there is formed a strip-shaped thin film conductor 21 whose longitudinal length is $\lambda g/2$ (where $\lambda g$ is a guide wavelength). In this arrangement, the main transmission line L1 in the form of a microstrip line is made up of the thin film conductor 21, the earth conductor 11, and the dielectric substrate 10 sandwiched between the thin film conductor 21 and the earth conductor 11. Further, on the thin film conductor 21, there are formed the thin film dielectric 31, the thin film conductor 22, the thin film dielectric 32, the thin film conductor 23, the thin film dielectric 33, the thin film conductor 24, the thin film dielectric 34, and the thin film conductor 25 so as to be stacked in this order. In this case, the sub-transmission lines L2 to L5 are formed in the following way:

(a) the thin film dielectric 31 is sandwiched between a pair of thin film conductors 21 and 22, and this results in the sub-transmission line L2

(b) the thin film dielectric 32 is sandwiched between a pair of thin film conductors 22 and 23, and this results in the sub-transmission line L3

(c) the thin film dielectric 33 is sandwiched between a pair of thin film conductors 23 and 24, and this results in the sub-transmission line L4 and (d) the thin film dielectric 34 is sandwiched between a pair of thin film conductors 24 and 25, and this results in the sub-transmission line L5.

It is noted that the film thickness $\Delta\xi$ of each of the thin film conductors 21 to 25 and the film thickness $\Delta x_s$ of each of the respective thin film dielectrics 31 to 34 are set as detailed later by using the flow for determining the optimum parameters of FIG. 12.

Further, on the dielectric substrate 10, an input-terminal conductor 12 is formed a predetermined gap g1 away from one longitudinal end of the thin film conductor 21 and close enough thereto to be electromagnetically coupled with each other, while an output-terminal conductor 13 is formed a predetermined gap g2 away from another longitudinal end of the thin film conductor 21 and close enough thereto to be electromagnetically coupled with each other. It is noted that in the first embodiment, the coupling between the input-terminal conductor 12 and one end of the thin film conductor 21 and the coupling between the output-terminal conductor 13 and another end of the thin film conductor 21 are both capacitive couplings.

In the present case, the dielectric substrate 10 is made of, for example, sapphire, which is an alumina single crystal, while the thin film dielectrics 31 to 34 are made of, for example, $SiO_2$. On the other hand, the earth conductor 11 and the thin film conductors 21 to 25 are made of a conductor such as Cu, Ag, or Au having an electric conductivity.

FIG. 2 shows electric field and magnetic field distributions in the half-wavelength line type resonator which is constructed as described above.

As seen from FIG. 2, the electric fields are distributed in a direction perpendicular to the surfaces of the thin film conductors 21 to 25 and identical to one another. On the other hand, the magnetic fields are distributed in a direction parallel to the surfaces of the thin film conductors 21 to 25 and identical to one another. From this fact, it can be seen that the electromagnetic fields of the respective transmission lines L1 to L5 are coupled with one another.

Figure 3:
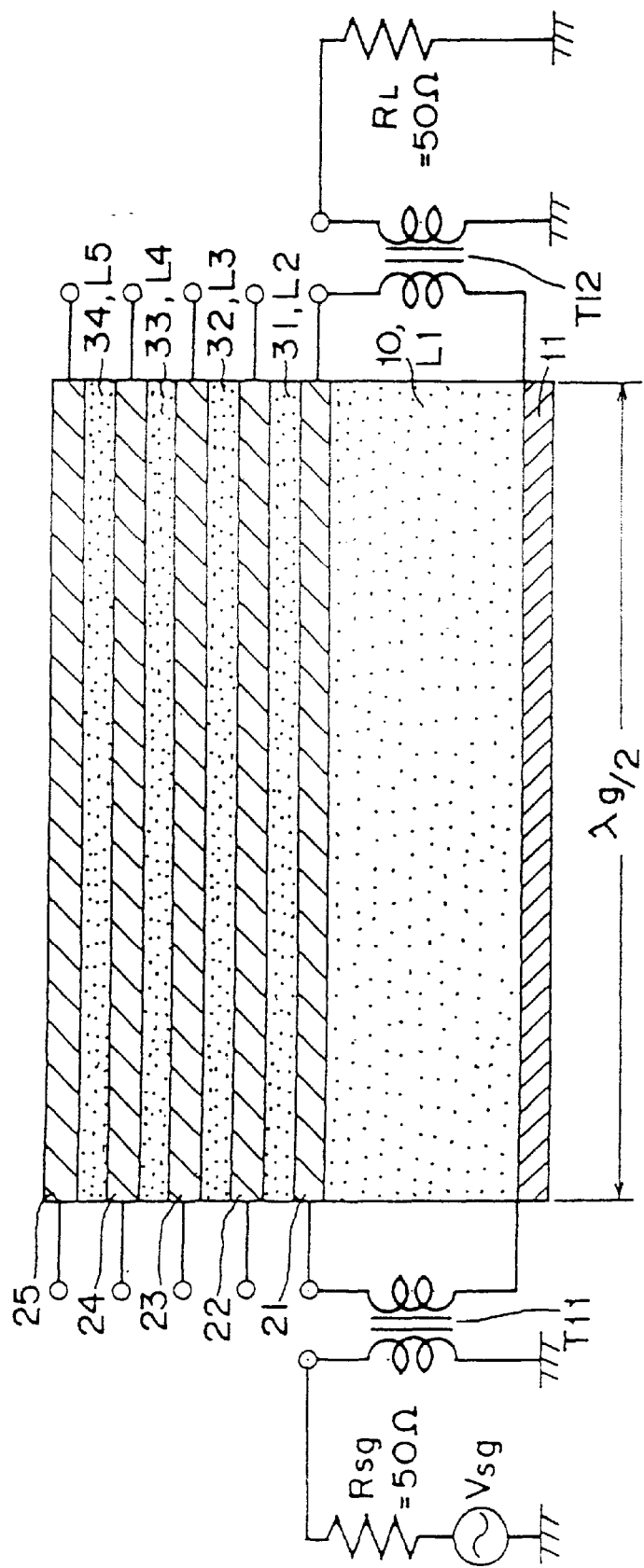
FIG. 3 is a schematic longitudinal sectional view of the half-wavelength line type resonator of FIG. 1 taken in the longitudinal direction thereof, and a circuit diagram of a circuit connected thereto.
Figure 4:
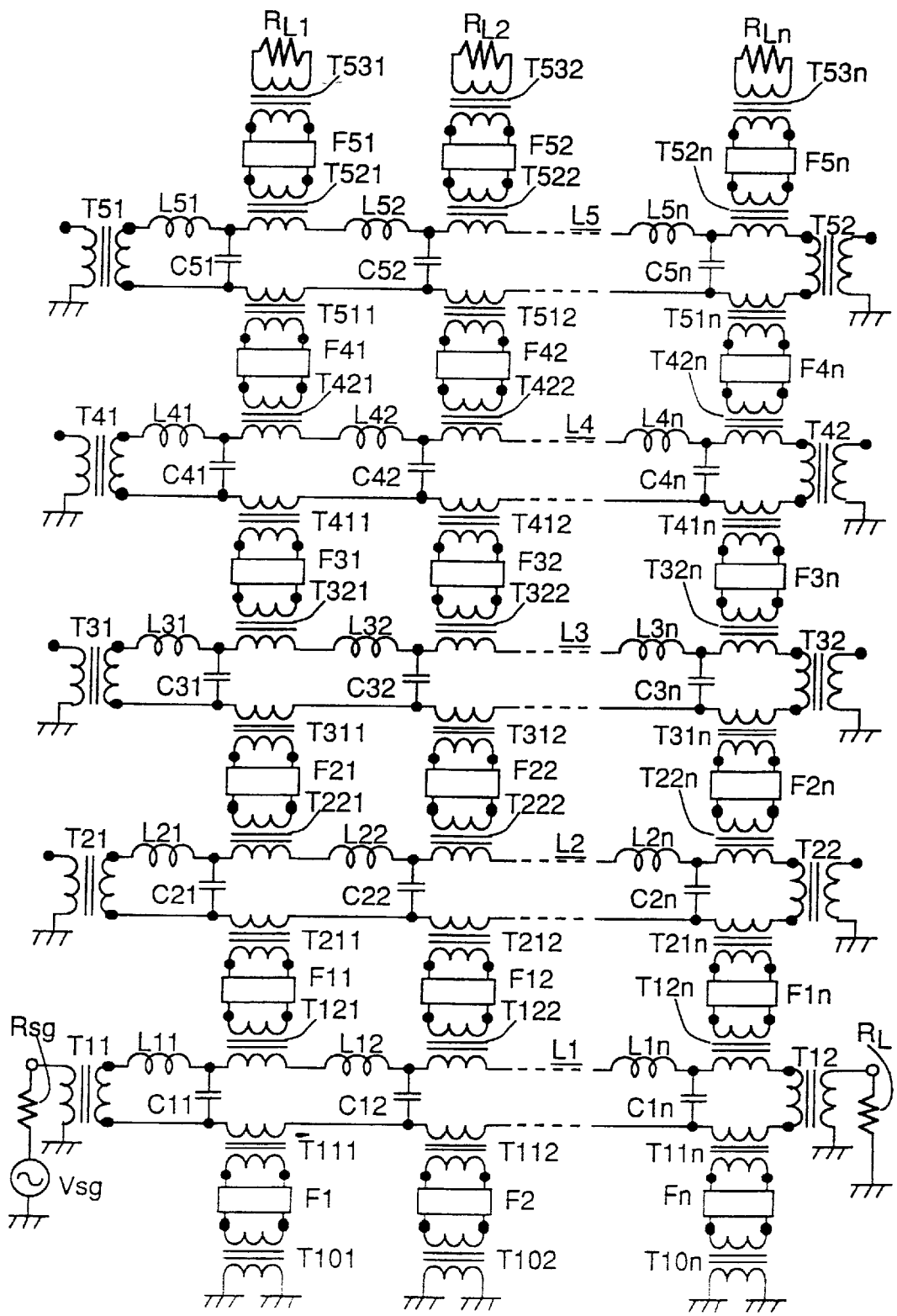
FIG. 4 is a circuit diagram of an equivalent circuit of the half-wavelength line type resonator of FIG. 1.

FIG. 3 is a schematic longitudinal sectional view of the half-wavelength line type resonator of FIG. 1 in its longitudinal direction, and a circuit diagram of a circuit connected thereto, and FIG. 4 is a circuit diagram of an equivalent circuit of the half-wavelength line type resonator of FIG. 1.

As shown in FIG. 4, the main transmission line L1 comprises a distributed constant circuit comprised of LC unit distributed constant circuits connected in series and having inductors L11, L12, ..., L1n and capacitors C11, C12, ..., C1n. A signal generator Vsg for exciting the resonator Vsg and its internal resistance Rsg are connected to one end of the main transmission line L1 via an ideal transformer T11 having a turn ratio corresponding to the gap g1, while a load resistance $R_L$ is connected to another end of the main transmission line L1 via an ideal transformer T12 having a turn ratio corresponding to the gap g2. It is noted that the turn ratio of all the following ideal transformers is 1:1. In the main transmission line L1, ideal transformers T111, T112, ..., T11n are inserted so as to be connected to the lower line in the figure between the respective unit distributed constant circuits, and the ideal transformers T111, T112, ..., T11n are grounded via four-terminal circuits F1, F2, ..., Fn, which comprise a distributed constant circuit including a loss resistance, and via ideal transformers T101, T102, ..., T10n, respectively.

Figure 22:
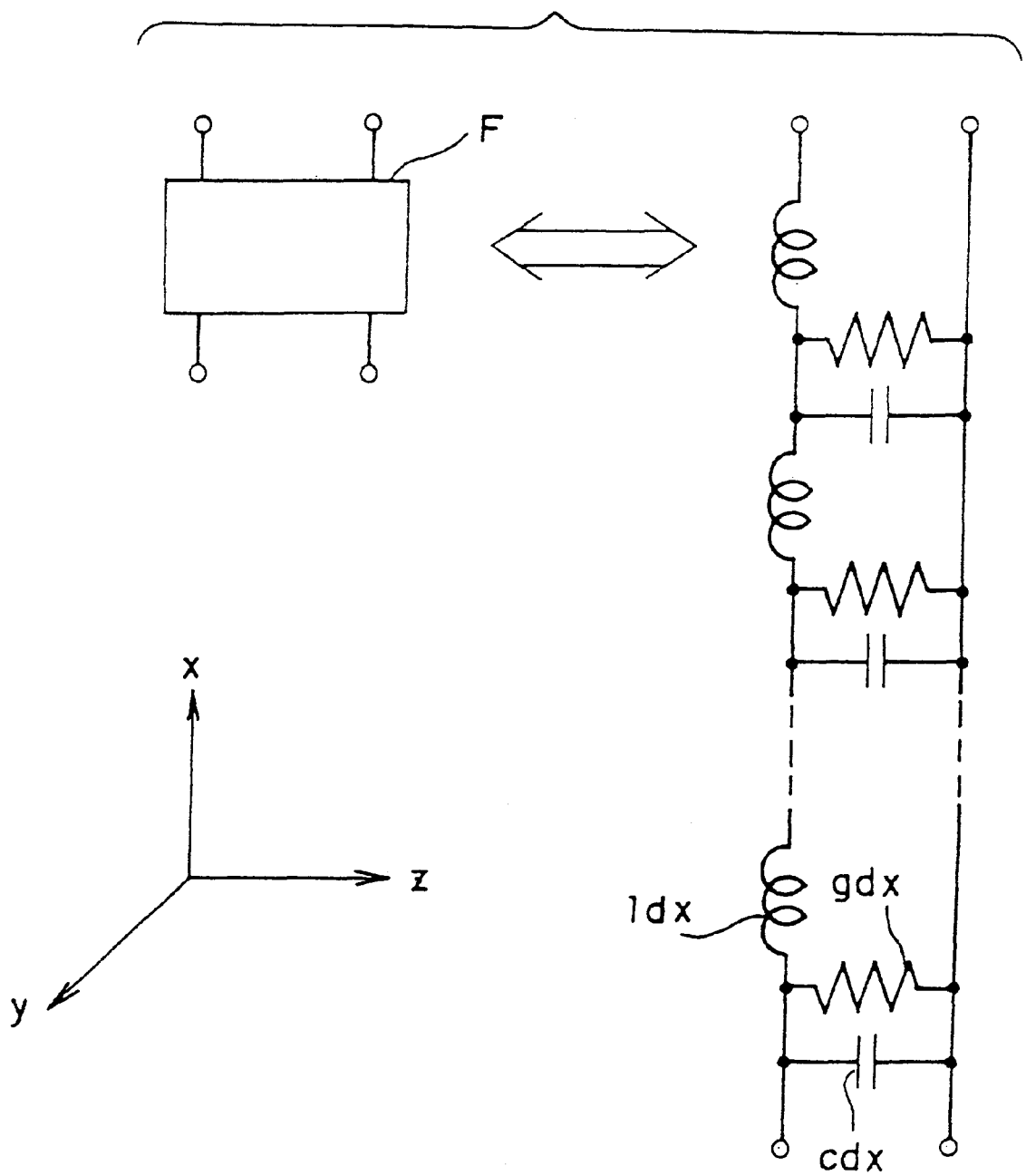
FIG. 22 is a circuit diagram showing an equivalent circuit of a four-terminal circuit in FIG. 4.

It is noted that the four-terminal circuits (denoted by "F+number") which appear hereinbelow are equivalent circuits of the earth conductor 11 and the thin film conductors 21 to 25, and each of the four-terminal circuit comprises a distributed constant circuit including a loss resistance as shown in FIG. 22. More specifically, each of the four-terminal circuits comprises an equivalent circuit in which a plurality of unit circuits each comprising a unit conductance gdx, a unit capacitance cdx, and a unit inductance ldx are connected in series. In this case, the unit conductance gdx, the unit capacitance cdx, and the unit inductance ldx are represented by the following equations, respectively:

$$gdx = \sigma(\Delta y/dz)dx,$$

$$cdx = \epsilon o(\Delta y/dz)dx, \text{ and}$$

$$ldx = \mu o(dz/\Delta y)dx,$$

where σ is an electric conductivity of the earth conductor 11 and the thin film conductors 21 to 25;
εo is a dielectric constant in vacuum;
μo is a permeability in vacuum;
dx is an infinitesimal length of the earth conductor 11 and the thin film conductors 21 to 25 in the direction of thickness thereof;
Δy is a line width; and
dz is an infinitesimal length in the direction of propagation.

The sub-transmission line L2 comprises a distributed constant circuit in which LC unit distributed constant circuits are connected in series and which has inductors L21, L22, ..., L2n and capacitors C21, C22, ..., C2n. An ideal transformer T21 whose primary turn is open is connected to one end of the sub-transmission line L2 while an ideal transformer T22 whose secondary turn is open is connected to another end of the sub-transmission line L2. Further, the sub-transmission lines L3, L4, and L5 are made up in the following way similar to that of the sub-transmission line L2. The sub-transmission line L3 comprises a distributed constant circuit in which LC unit distributed constant circuits are connected in series and which has inductors L31, L32, ..., L3n and capacitors C31, C32, ..., C3n. An ideal transformer T31 whose primary turn is open is connected to one end of the sub-transmission line L3, while an ideal transformer T32 whose secondary turn is open is connected to another end of the sub-transmission line L3. Also, the sub-transmission line L4 comprises a distributed constant circuit in which LC unit distributed constant circuits are connected in series and which has inductors L41, L42, ..., L4n and capacitors C41, C42, ..., C4n. An ideal transformer T41 whose primary turn is open is connected to one end of the sub-transmission line L4, while an ideal transformer T42 whose secondary turn is open is connected to another end of the sub-transmission line L4. Further, the sub-transmission line L5 comprises a distributed constant circuit in which LC unit distributed constant circuits are connected in series and which has inductors L51, L52, ..., L5n and capacitors C51, C52, ..., C5n. An ideal transformer T51 whose primary turn is open is connected to one end of the sub-transmission line L5, while an ideal transformer T52 whose secondary turn is open is connected to another end of the sub-transmission line L5.

An equivalent circuit within the thin film conductor 21 for connecting the adjacent transmission lines L1 and L2 to each other is made up in the following way. That is, in the main transmission line L1, ideal transformers T121, T122, ..., T12n are inserted so as to be connected to the upper line in the figure between the unit distributed constant circuits. The ideal transformers T121, T122, ..., T12n are connected respectively to ideal transformers T211, T212, ..., T21n inserted so as to be connected to the lower line in the figure between the unit distributed constant circuits of the sub-transmission line L2, respectively, via four-terminal circuits F11, F12, F1n corresponding to the thin film conductor 21.

Also, an equivalent circuit within the thin film conductor 22 for connecting the adjacent transmission lines L2 and L3 to each other is made up in the following way. That is, in the sub-transmission line L2, ideal transformers T221, T222, ..., T22n are inserted so as to be connected to the upper line in the figure between the unit distributed constant circuits. The ideal transformers T221, T222, ..., T22n are connected respectively to ideal transformers T311, T312, . . . , T31n inserted so as to be connected to the lower line in the figure between the unit distributed constant circuits of the sub-transmission line L3, respectively, via four-terminal circuits F21, F22, . . . , F2n corresponding to the thin film conductor 22.

Further, an equivalent circuit within the thin film conductor 23 for connecting the adjacent transmission lines L3 and L4 to each other is made up in the following way. That is, in the sub-transmission line L3, ideal transformers T321, T322, . . . , T32n are inserted so as to connected to the upper line in the figure between the unit distributed constant circuits. The ideal transformers T321, T322, . . . , T32n are connected respectively to ideal transformers T411, T412, . . . , T41n inserted so as to be connected to the lower line in the figure between the unit distributed constant circuits of the sub-transmission line L4, respectively, via four-terminal circuits F31, F32, . . . , F3n corresponding to the thin film conductor 23.

Still further, an equivalent circuit within the thin film conductor 24 for connecting the adjacent transmission lines L4 and L5 to each other is made up in the following way. That is, in the sub-transmission line L4, ideal transformers T421, T422, . . . , T42n are inserted so as to be connected to the upper line in the figure between the unit distributed constant circuits. The ideal transformers T421, T422, . . . , T42n are connected respectively to ideal transformers T511, T512, . . . , T51n inserted so as to be connected to the lower line in the figure between the unit distributed constant circuits of the sub-transmission line L5, respectively, via four-terminal circuits F41, F42, . . . , F4n corresponding to the thin film conductor 24.

Further, an equivalent circuit corresponding to the electromagnetic field distribution formed from the thin film conductor 25 toward the space is made up in the following way. That is, in the sub-transmission line L5, ideal transformers T521, T522, . . . , T52n are inserted so as to be connected to the upper line in the figure between the unit distributed constant circuits. The ideal transformers T521, T522, . . . , T52n are connected respectively to load resistances $R_{L1}$, $R_{L2}$, . . . , $R_{Ln}$, respectively, via four-terminal circuits F51, F52, . . . , F5n and ideal transformers T531, T532, . . . , T53n corresponding to the thin film conductor 25.

Next, described below are a flow for determining the optimum parameters in the resonator of FIG. 1 and a flow for determining a minimized surface resistance Rs, with the use of the following parameters:

n: a number of multilayered layers,

ωo: a transmission (excitation) angular frequency which is used, $\mu o$: a permeability in vacuum, σ: an electric conductivity of each of the thin film conductors 21 to 25, δo: a skin depth at a transmission angular frequency ωo, $\epsilon_s$: a dielectric constant of each of the thin film dielectrics 31 to 34 of the sub-transmission lines L2 to L5, $\epsilon_m$: a dielectric constant of the dielectric substrate 10 of the main transmission line L1, $\Delta x_s$: a film thickness of each of the thin film dielectrics 31 to 34 of the sub-transmission lines L2 to L5, $\Delta x_m$: a substrate thickness of the dielectric substrate 10 of the main transmission line L1, $\Delta \xi$: a film thickness of each of the thin film conductors 21 to 25, Δy: (a line width)=(a width of each of the thin film conductors 21 to 25)=(a width of each of the thin film dielectrics 31 to 34), $\beta_s$: a phase constant of each of the sub-transmission lines L2 to L5, and $\beta_m$: a phase constant of the main transmission line L1.

The recursion formula of a complex impedance Z on the transmission lines L1 to L5 normalized into a dimensionless expression based on the equivalent circuit as shown in FIG. 4 can be represented by the following Equation (1a):

$$Zk = -jw + Z + [Y + (Z + Z_{k+1})^{-1}]^{-1},$$

$$k = 0, 1, 2, \ldots, n-1 \tag{1a}$$

where an n-th complex impedance $Z_n$ is represented as follows:

$$Z_n = \sqrt{\left(\frac{\mu o}{\varepsilon o}\right) \cdot \sigma \delta o} \tag{1b}$$

In the above equations, the subscript k of the complex impedance Z shows a line number numbered in the increasing order from 0 for the main transmission line L1 toward the upper-layer sub-transmission lines L2 to L5. Also, the complex impedance Z and the complex admittance Y are defined respectively by functions represented each with a medium parameter ξ used as a parameter by the following Equation (2) and Equation (3):

$$Z = (1+j) \cdot \tan h[(1+j)/2 \cdot \xi] \tag{2, and}$$

$$Y = 1/(1+j) \cdot \sin h[(1+j) \cdot \xi] \tag{3}.$$

Further, a structural parameter w and the medium parameter ξ are defined respectively by the following Equation (4) and Equation (5):

$$w = \{2\Delta x_s / \delta o\} \cdot (\epsilon_m / \epsilon_s - 1) \tag{4, and}$$

$$\xi = \Delta \xi / \delta o \tag{5}$$

where δo is a skin depth at a transmission angular frequency wo and defined by the following Equation (6):

$$\delta o = \sqrt{\frac{2}{\omega o \mu o \sigma}} \tag{6}$$

Since the complex impedance $Z_n$ can be given as a boundary condition of a vacuum layer as shown in the Equation (1b), a complex impedance $Z_0$ is defined as a two-parameter function of the structural parameter w and the medium parameter ξ by the following Equation (7):

$$Z_0 = Z_0(w, \xi) \tag{7}.$$

In the above Equation (7), when the real part of the complex impedance $Z_0$ is the minimum, the surface resistance $R_s$ of the thin film multilayered transmission lines becomes the minimum. Accordingly, the structural parameter w and the medium parameter ξ obtained when the surface resistance $R_s$ is the minimum are referred to as optimum set values, and are represented as $w_{opt}$ and $\xi_{opt}$, respectively. In this case, the following Equation (8) holds:

$$R_s = \text{Re } [Z_0(w_{opt}, \xi_{opt})]/\sigma \delta o \tag{8}.$$

If the optimum values $w_{opt}$ and $\xi_{opt}$ are substituted into the above Equation (8), the dielectric film thickness $\Delta x_s$ and the conductor film thickness $\Delta \xi$ of each of the sub-transmission lines L2 to L4 are determined, and then, the following Equations (9) and (10) are obtained:

$$\Delta x_s = w_{opt} \delta o / 2 \cdot (\epsilon_m/\epsilon_s - 1)^{-1} \qquad (9), \text{ and}$$

$$\Delta \xi = \xi_{opt} \delta o \qquad (10).$$

Next, description is made hereinafter on a method for determining the optimum parameters $w_{opt}$ and $\xi_{opt}$ and the minimized surface resistance Rs in the half-wavelength line type resonator according to the present invention. In this case, it is assumed that a number n of multilayered layers, an electric conductivity $\sigma$ of each of the thin film conductors 21 to 25, a skin depth $\delta o$, a dielectric constant $\epsilon_s$ of each of the thin film dielectrics 31 to 34, and a dielectric constant $\epsilon_m$ of the dielectric substrate 10 are previously given.

Figure 14:
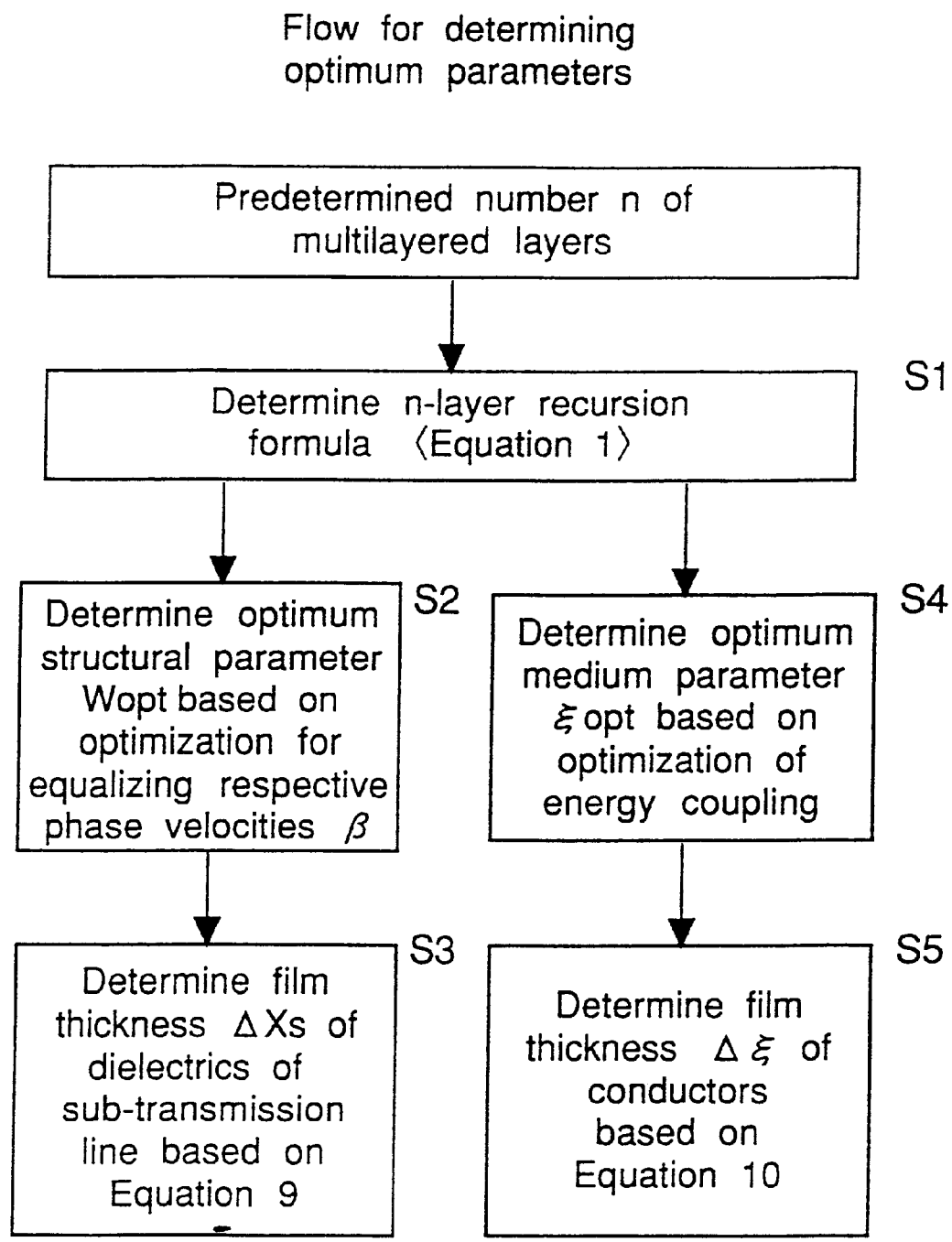
FIG. 14 is a flow chart showing a flow for determining optimum parameters in the half-wavelength line type resonator of FIG. 1.

FIG. 14 is a flow chart showing a flow for determining the optimum parameters $w_{opt}$ and $\xi_{opt}$ in the half-wavelength line type resonator according to the present invention.

As shown in FIG. 14, at step S1, the n-layer recursion formula (1) is determined based on the predetermined number n of multilayered layers. Then, the following determinations are made based on the n-layer recursion formula.

At step S2, the optimum structural parameter $w_{opt}$ is determined based on optimization for equalizing phase velocities $\beta$ of TEM waves which propagate through the transmission lines L1 to L5. Then at step S3, the film thickness $\Delta x_s$ of each of the thin film dielectrics 31 to 34 of the sub-transmission lines L2 to L5 is determined based on the Equation (9).

On the other hand, at step S4, the optimum structural parameter $\xi_{opt}$ is determined based on the optimization of energy coupling. Then at step S5, the film thickness $\Delta \xi$ of each of the thin film conductors 21 to 25 is determined based on the Equation (10). Concretely, at steps S2 and S4, such a structural parameter w and a medium parameter $\xi$ are determined so that the real part $\text{Re}[Z_0(w, \xi)]$ of the dimensionless impedance $Z_0 = Z_0(w, \xi)$ for k=0 determined by the n-layer recursion formula of the Equation (1) becomes the minimum, and then, the resulting values are taken as the optimized structural parameter $w_{opt}$ and the medium parameter $\xi_{opt}$.

Figure 15:
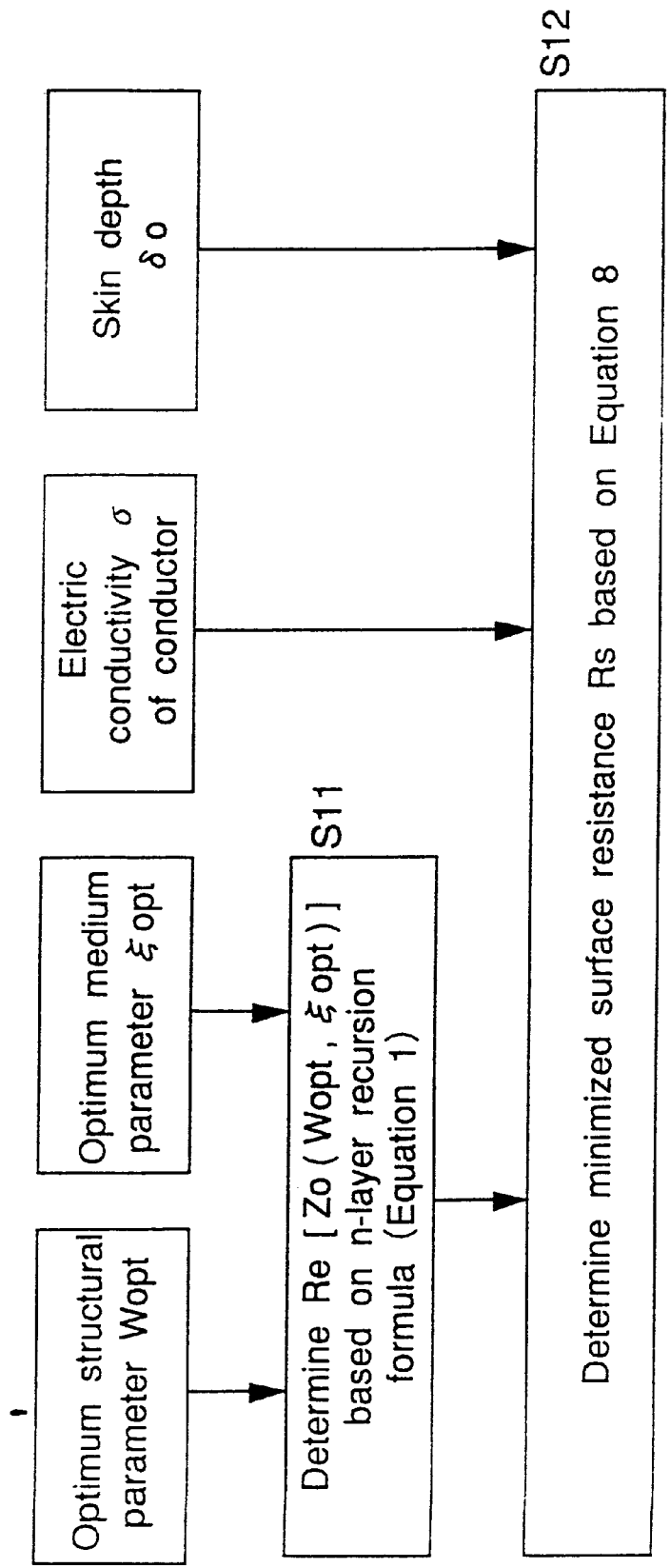
FIG. 15 is a flow chart showing a flow for determining a minimized surface resistance in the half-wavelength line type resonator of FIG. 1.

FIG. 15 is a flow chart showing a flow for determining the minimized surface resistance Rs in the half-wavelength line type resonator according to the present invention. As shown in FIG. 15, at step S11, the value of $\text{Re}[Z_0(w_{opt}, \xi_{opt})]$ is determined based on the n-layer recursion formula of the Equation (1) from the optimized structural parameter $w_{opt}$ and the optimized medium parameter $\xi_{opt}$. Then at step S12, the minimized surface resistance Rs is determined by substituting the value of $\text{Re}[Z_0(w_{opt}, \xi_{opt})]$ determined at step S11, the electric conductivity a of each of the thin film conductors 21 to 25, and the skin depth $\delta o$ into the Equation (8).

In the present embodiment, the effective dielectric constant of each of the thin film dielectrics 31 to 34 constituting the sub-transmission lines L2 to L5 is preferably set to be smaller than the effective dielectric constant of the dielectric substrate 10 constituting the main transmission line L1. By this arrangement, the phase velocity of the electromagnetic wave which propagates through the first transmission line L1 and the phase velocity of the TEM wave which propagates through at least one of the second transmission lines L2 to L5 can be substantially made equal to each other.

In the present embodiment, the thickness of each of the thin film dielectrics 31 to 34 constituting the sub-transmission lines L2 to L5 is made smaller than the thickness of the dielectric substrate 10 constituting the main transmission line L1. By this arrangement, a time required for a film forming process of the sub-transmission lines L2 to L5 can be reduced, and a low-impedance transmission line having an impedance lower than that of the sub-transmission lines L2 to L5 can be constituted, then, this results in a reduced transmission loss.

In the above determination flows of FIG. 14 and FIG. 15, the dielectric constant $\epsilon_s$ of each of the thin film dielectrics 31 to 34 is previously given and then their film thickness $\Delta x_s$ is determined. However, the present invention is not limited to this, but it may be arranged so that, as apparent from the Equation (4), the film thickness $\Delta x_s$ of each of the thin film dielectrics 31 to 34 is previously given and then their dielectric constant $\epsilon_s$ may be determined.

In addition, since it is assumed that the electromagnetic fields are uniform in the widthwise direction of the transmission lines L1 to L5, determination of the film thickness in the above-mentioned optimization will be affected neither by the substrate thickness $\Delta x_m$ of the dielectric substrate 10 of the main transmission line L1 nor by (the line width)=(the width of each of the thin film conductors 21 to 25)=(the width $\Delta y$ of each of the thin film dielectrics 31 to 34).

Figure 5:
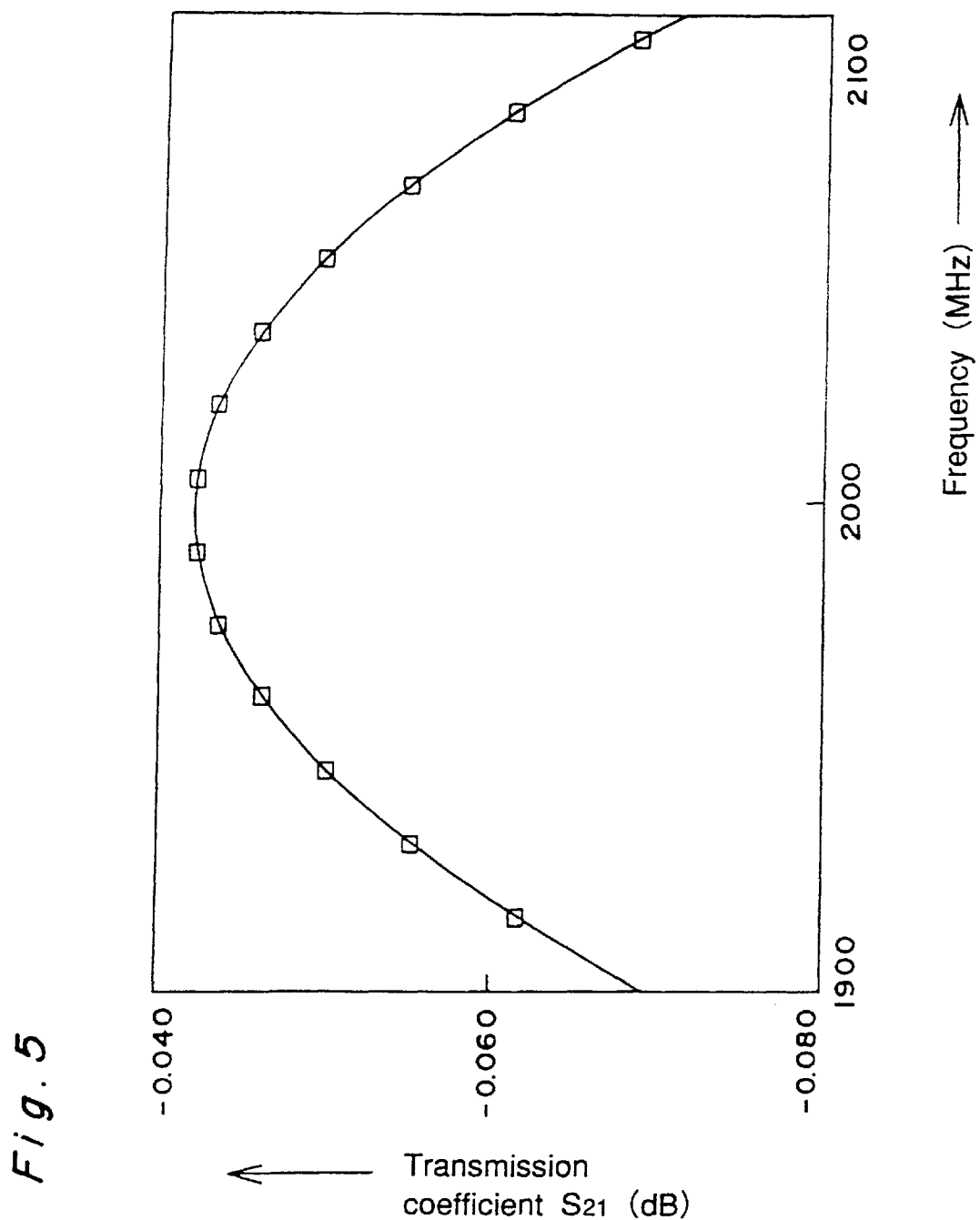
FIG. 5 is a graph showing a frequency characteristic of a transmission coefficient $S_{21}$, which is a simulation result of the half-wavelength line type resonator of FIG. 1.
Figure 6:
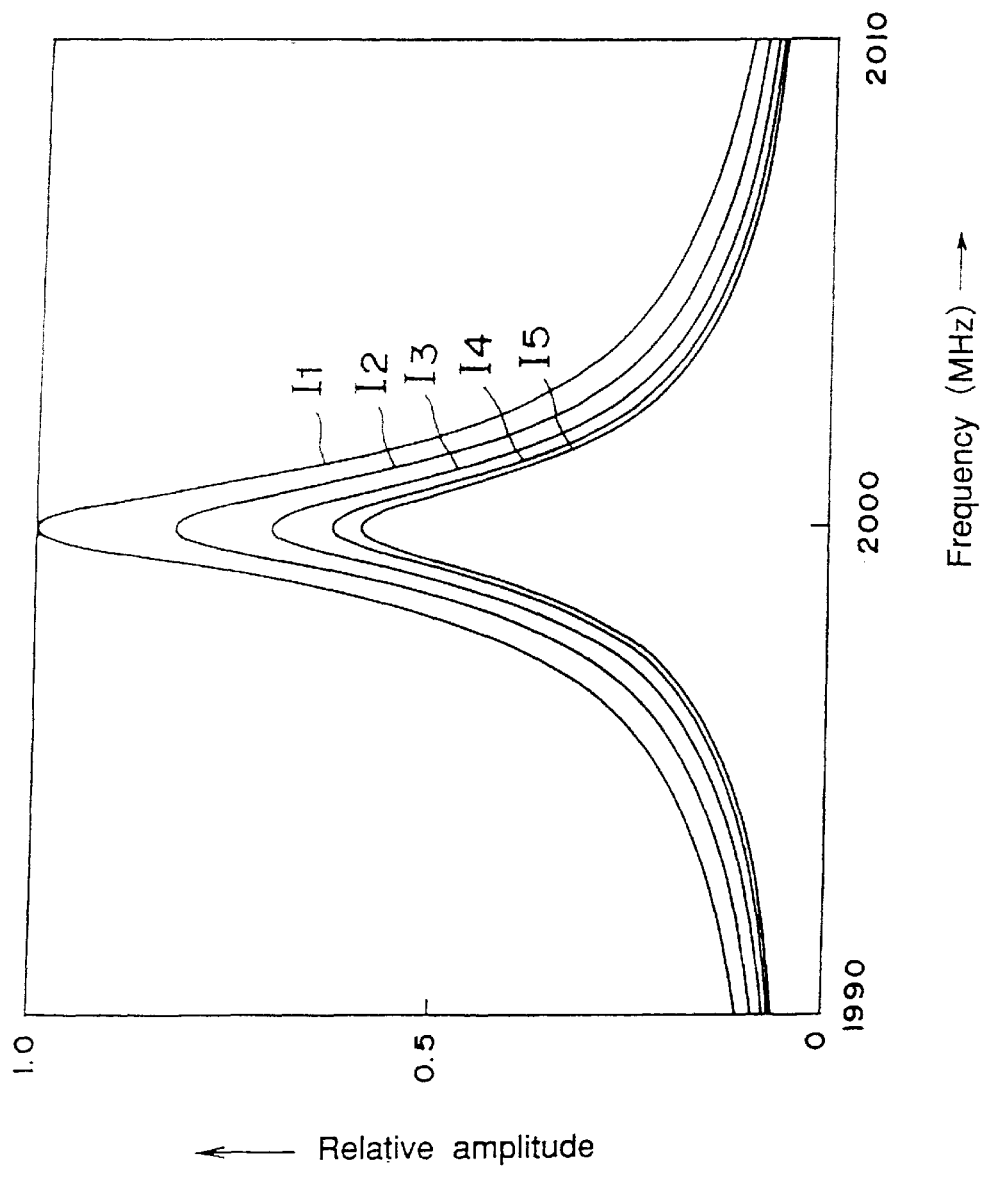
FIG. 6 is a graph showing frequency characteristics of relative amplitudes of currents flowing through the thin film conductors which are simulation results of the half-wavelength line type resonator of FIG. 1.
Figure 7:
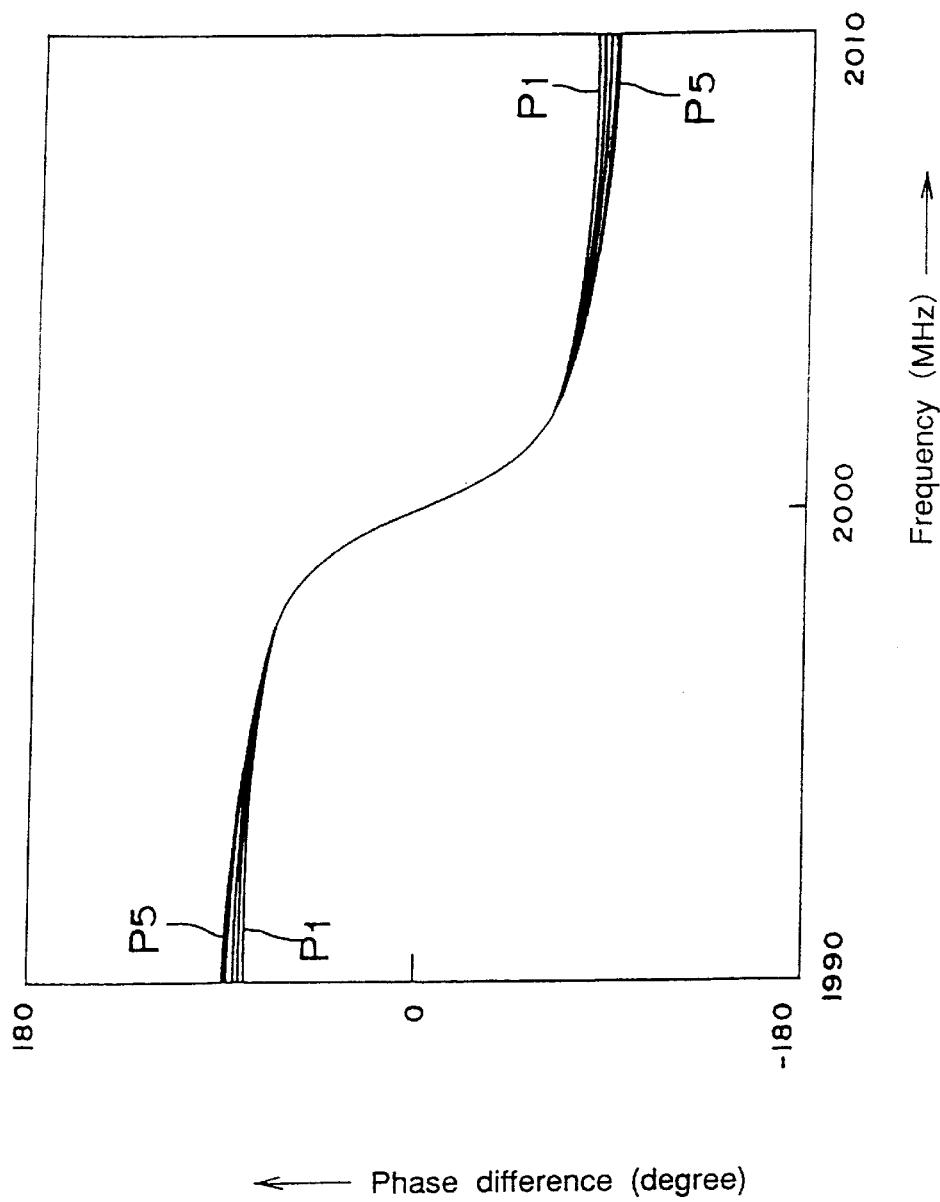
FIG. 7 is a graph showing frequency characteristics of phase differences of currents flowing through the thin film conductors which are simulation results of the half-wavelength line type resonator of FIG. 1.

The present inventors has made computer simulation based on the equivalent circuit of the half-wavelength line type resonator which is described with reference to FIG. 4, and its results are shown hereinafter. FIG. 5 is a graph showing a frequency characteristic of a transmission coefficient $S_{21}$, and FIG. 6 is a graph showing frequency characteristics of relative amplitudes of currents flowing through the thin film conductors 21 to 25 of the half-wavelength line type resonator of FIG. 1. In FIG. 6, reference numbers I1, I2, I3, I4 and I5 denote the values of the relative amplitudes of the currents flowing through the thin film conductors 21 to 25, respectively. FIG. 7 is a graph showing frequency characteristics of phase differences of currents flowing through the thin film conductors 21 to 25 of the half-wavelength line type resonator of FIG. 1. In FIG. 7, reference numbers P1 to P5 denote the values of phase differences of the currents flowing through the thin film conductors 21 to 25, respectively. In this case, the parameters for the present simulation were set as follows:

(a) the relative dielectric constant (effective value) $\epsilon_{mr}$ of the dielectric substrate 10=6.43, (b) the substrate thickness $\Delta x_m$ of the dielectric substrate 10=330 $\mu$m, (c) the relative dielectric constant $\epsilon_{sr}$ of each of the thin film dielectrics 31 to 34=3.80, (d) the film thickness of each of the thin film dielectrics 31 to 34 $\Delta x_s$=1.40 $\mu$m, (e) the electric conductivity $\sigma$ of each of the thin film conductors 21 to 25=5.80×10$^7$ S/m (material: Cu), (f) the film thickness $\Delta \xi$ of each of the thin film conductors 21 to 25=0.97 $\mu$m, (g) the electric conductivity of the earth conductor 11 $\sigma$=5.80×10$^7$ S/m (material: Cu), and (h) the film thickness of the earth conductor 11 $\Delta \xi_m$=5.00 $\mu$m.

As understood from FIG. 5, a transmission characteristic was obtained which has a transmission coefficient $S_{21}$=approximately −0.042 dB at a center frequency of 2000 MHz.

Also, as understood from FIG. 6, the relative amplitudes of the currents flowing through the thin film conductors 21 to 25 become the maximum at a resonance frequency of 2000 MHz. The relative amplitudes of the currents flowing through the thin film conductors 21 to 25 at the same resonance frequency attenuates increasingly in the order from the thin film conductor 21 toward the thin film conductor 25. At the same time, the high frequency electromagnetic field energy flowing through the main transmission line L1 transfers to the thin film dielectrics 31 to 34 via the thin film conductors 21 to 25 each having a loss.

Further, as understood from FIG. 7, the phase differences of the currents flowing through the thin film conductors 21 to 25 become 0° at the resonance frequency of 2000 MHz and are equal to each other, and further, the phase differences are approximately ±90° at frequencies of 1990 and 2010 MHz.

Figure 8:
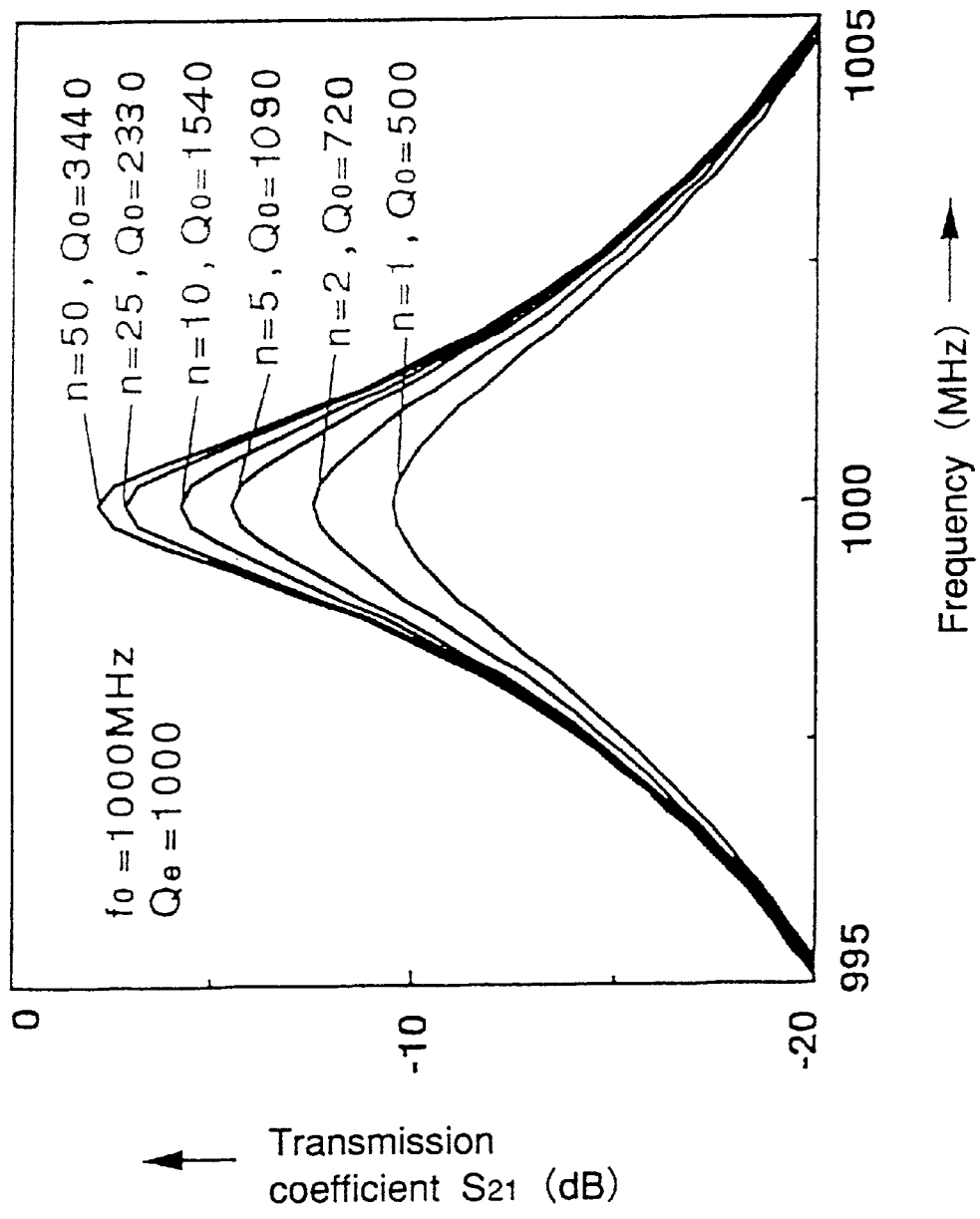
FIG. 8 is a graph showing frequency characteristics of transmission coefficients $S_{21}$ with a number n of multilayered layers used as a parameter, which are simulation results of the half-wavelength line type resonator of FIG. 1.
Figure 9:
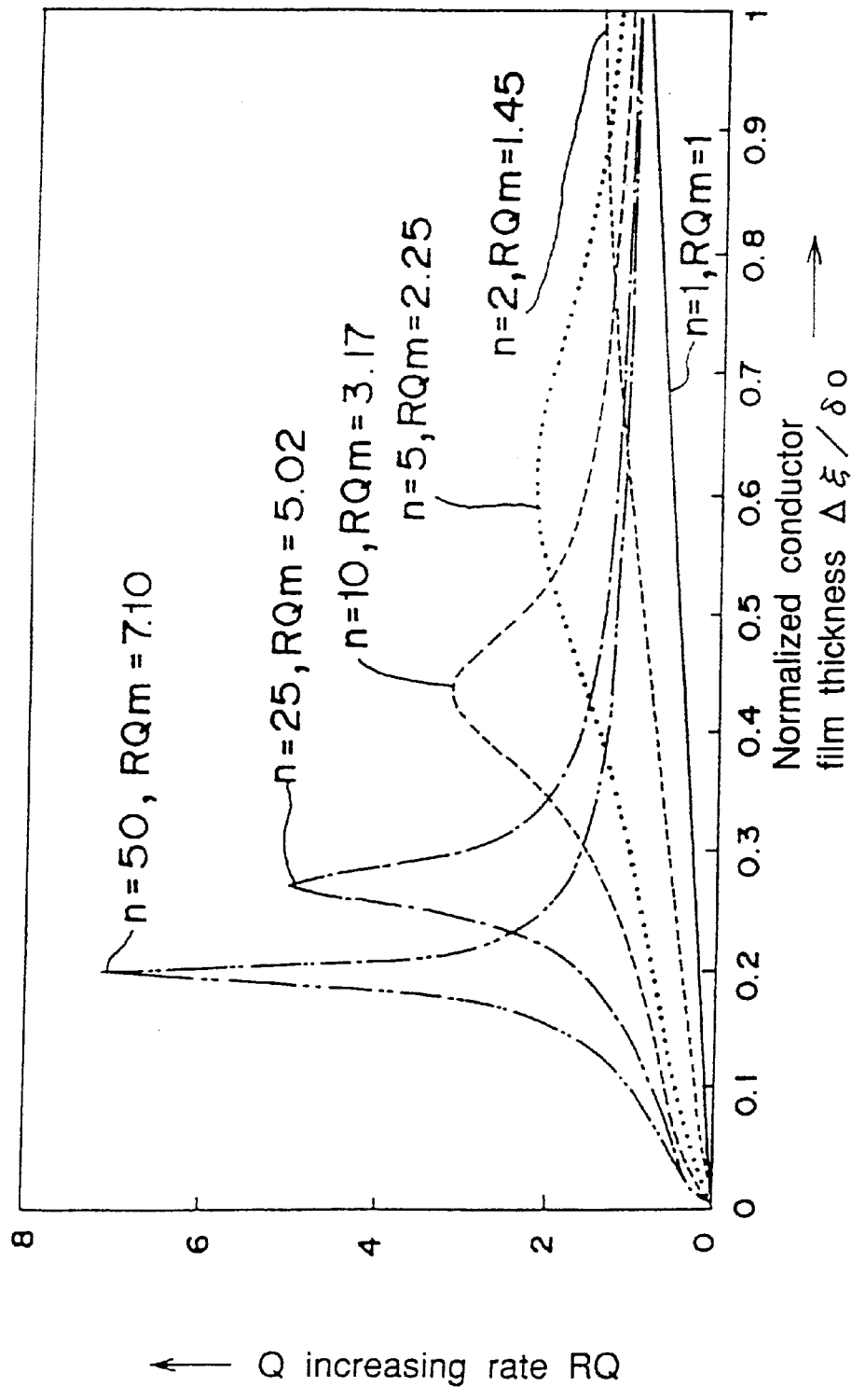
FIG. 9 is a graph showing normalized conductor film thickness $\Delta\xi/\delta o$ to Q increasing rate characteristics with the number n of multilayered layers used as a parameter, which are simulation results of the half-wavelength line type resonator of FIG. 1.
Figure 10:
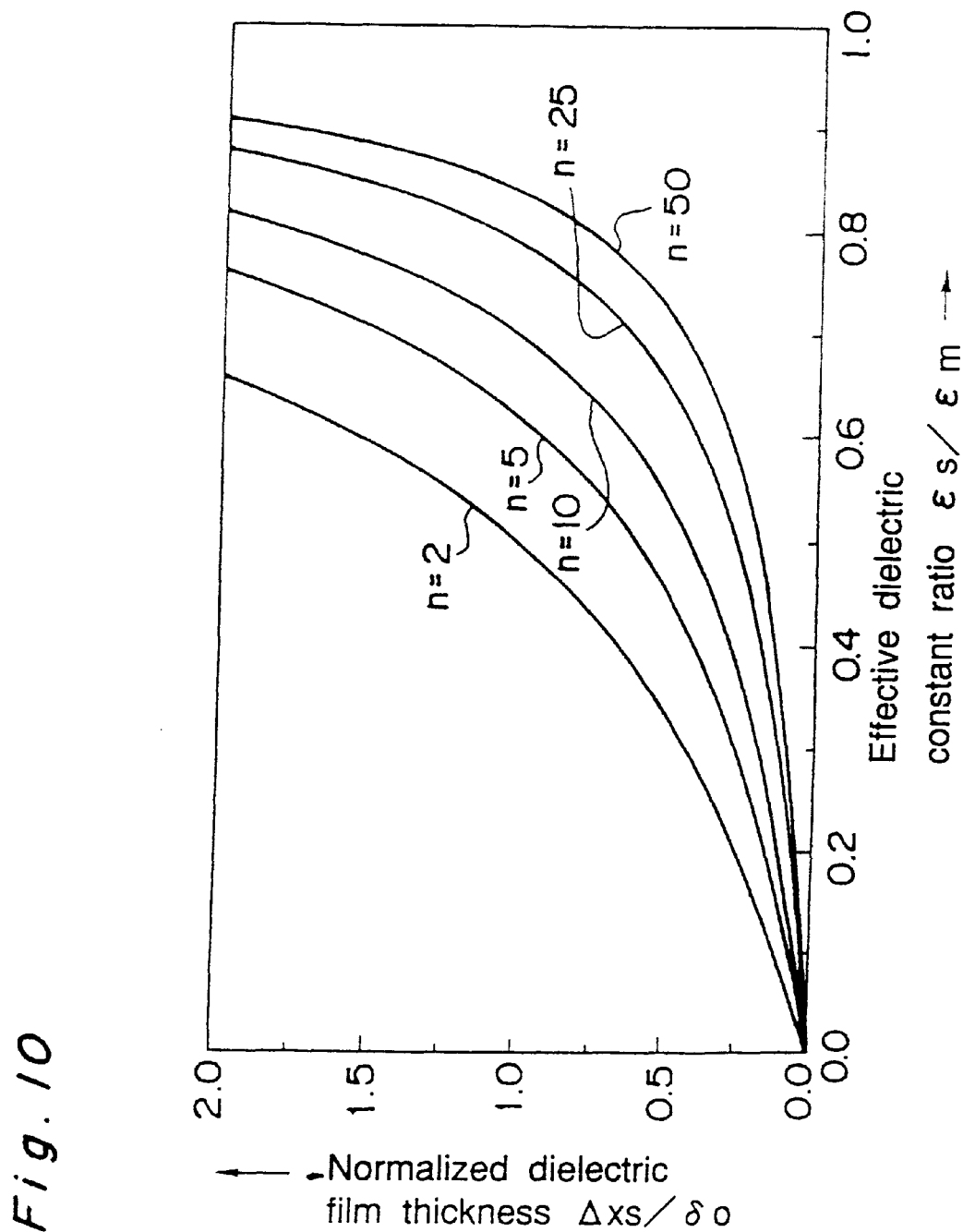
FIG. 10 is a graph showing optimum design conditions for equalizing phase velocities for an effective dielectric constant ratio $\epsilon_s/\epsilon_m$ to normalized dielectric film thickness $\Delta x_s/\delta o$ characteristic with the number n of multilayered layers used as a parameter, which is a simulation result of the half-wavelength line type resonator of FIG. 1.

FIG. 8 is a graph showing frequency characteristics of the transmission coefficients $S_{21}$ with the number n of multi-layered layers used as a parameter, which are simulation results of the half-wavelength line type resonator of FIG. 3, FIG. 9 is a graph showing a normalized conductor film thickness $\Delta\xi/\delta o$ to Q increasing rate RQ characteristic with the number n of multilayered layers used as a parameter, and FIG. 10 is a graph showing effective dielectric constant ratio $\epsilon_s/\epsilon_m$ to normalized dielectric film thickness $\Delta x_s/\delta o$ characteristics with the number n of multilayered layers used as a parameter. In this case, the parameters for the present simulation were set as follows:

(a) the relative dielectric constant (effective value) $\epsilon_{mr}$ of the dielectric substrate 10=90, (b) the substrate thickness $\Delta x_m$ of the dielectric substrate 10=500 μm, (c) the relative dielectric constant $\epsilon_{sr}$ of each of the thin film dielectrics 31 to 34=40.2, (d) the film thickness $\Delta x_s$ of each of the thin film dielectrics 31 to 34=1.27 μm, (e) the electric conductivity a of each of the thin film conductors 21 to 25=6.00×10$^7$ S/m (material: Ag), (f) the film thickness $\Delta\xi$ of each of the thin film conductors 21 to 25=1.27 μm, (g) the electric conductivity σ of the earth conductor 11=∞ (infinite), (h) the film thickness $\Delta\xi_m$ of the earth conductor 11=a finite value, and (i) the line length L=15.8 mm.

It is noted that the earth conductor 11 was assumed to be a perfect conductor in order to evaluate only the thin film multilayered electrode in the present simulation. This is actually equivalent to a structure which results when a mirror image is given with respect to a symmetrical plane of the boundary plane to a perfect conductor. That is, it corresponds to a model in which the thickness of the dielectric substrate 10 is doubled and a thin film multilayered electrode is formed on its both surfaces.

As apparent from FIG. 8, it can be understood that as the number n of multilayered layers is increased, the transmission coefficient $S_{21}$ at the resonance frequency (1000 MHz) increases, with the Q value also increasing. The optimum parameters $w_{opt}$ and $\xi_{opt}$, the real part Re [$Z_0$], the Q value, and the Q increasing rate RQ at various numbers n of multilayered layers are shown in Table 1, where the Q value=485 when n=1.

TABLE 1

| Number n of multi-layered layers | $w_{opt}$ | $\xi_{opt}$ | Re[$Z_0$] | Q value | Q increasing rate RQ |
|---|---|---|---|---|---|
| 2 | 2.0424 | 0.9984 | 0.6912 | 720 | 1.4468 |
| 5 | 1.2376 | 0.6168 | 0.4439 | 1090 | 2.2526 |
| 10 | 0.8703 | 0.4348 | 0.3146 | 1540 | 3.1788 |
| 25 | 0.5437 | 0.2718 | 0.1991 | 2330 | 5.0225 |
| 50 | 0.3920 | 0.1960 | 0.1408 | 3440 | 7.1025 |

Also, as apparent from FIG. 9, it can be understood that as the number n of multilayered layers is increased, the maximum RQm of Q increasing rate RQ with Q value for n=1 taken as a reference value increases, and that the maximum RQm of Q increasing rate can be obtained at a smaller predetermined value of normalized conductor film thickness $\Delta\xi/\delta o$.

Further, FIG. 10 shows results of calculating the relation between the normalized dielectric film thickness $\Delta x_s/\delta o$ and the effective dielectric constant ratio $\epsilon_s/\epsilon_m$ based on the equations resulting when the values of the optimum parameter $w_{opt}$ of Table 1 are substituted into the Equation (4). As apparent from FIG. 10, it can be understood that the smaller the effective dielectric constant ratio $\epsilon_s/\epsilon_m$ of each of the sub-transmission line L2 to L5 to the main transmission line L1 is, the smaller the film thickness $\Delta x_s$ of each of the thin film dielectrics 31 to 34 of the sub-transmission lines L2 to L5 can be made.

An operation of the half-wavelength line type resonator having the above-mentioned arrangement will be described hereinafter.

As previously described, (a) the film thickness $\Delta x_s$ and the dielectric constant $\epsilon_s$ of each of the thin film dielectrics 31 to 34 are set to the predetermined values, so that the phase velocities of the TEM waves which propagate through the transmission lines L1 to L5 are made substantially equal to one another; and (b) the film thickness $\Delta\xi$ of each of the thin film conductors 21 to 25 is set to the predetermined film thickness smaller than the skin depth δo of the frequency which is used, so that between the adjacent transmission lines L1 and L2, L2 and L3, L3 and L4, and L4 and L5, their electromagnetic fields are coupled with each other. By this arrangement, the high frequency energy flowing through the main transmission line L1 is transferred to the sub-transmission lines L2 to L5, so that the high frequency currents substantially uniformly flow through the thin film conductors 21 to 25, and then, the skin effect due to the high frequency is remarkably suppressed.

Figure 21:
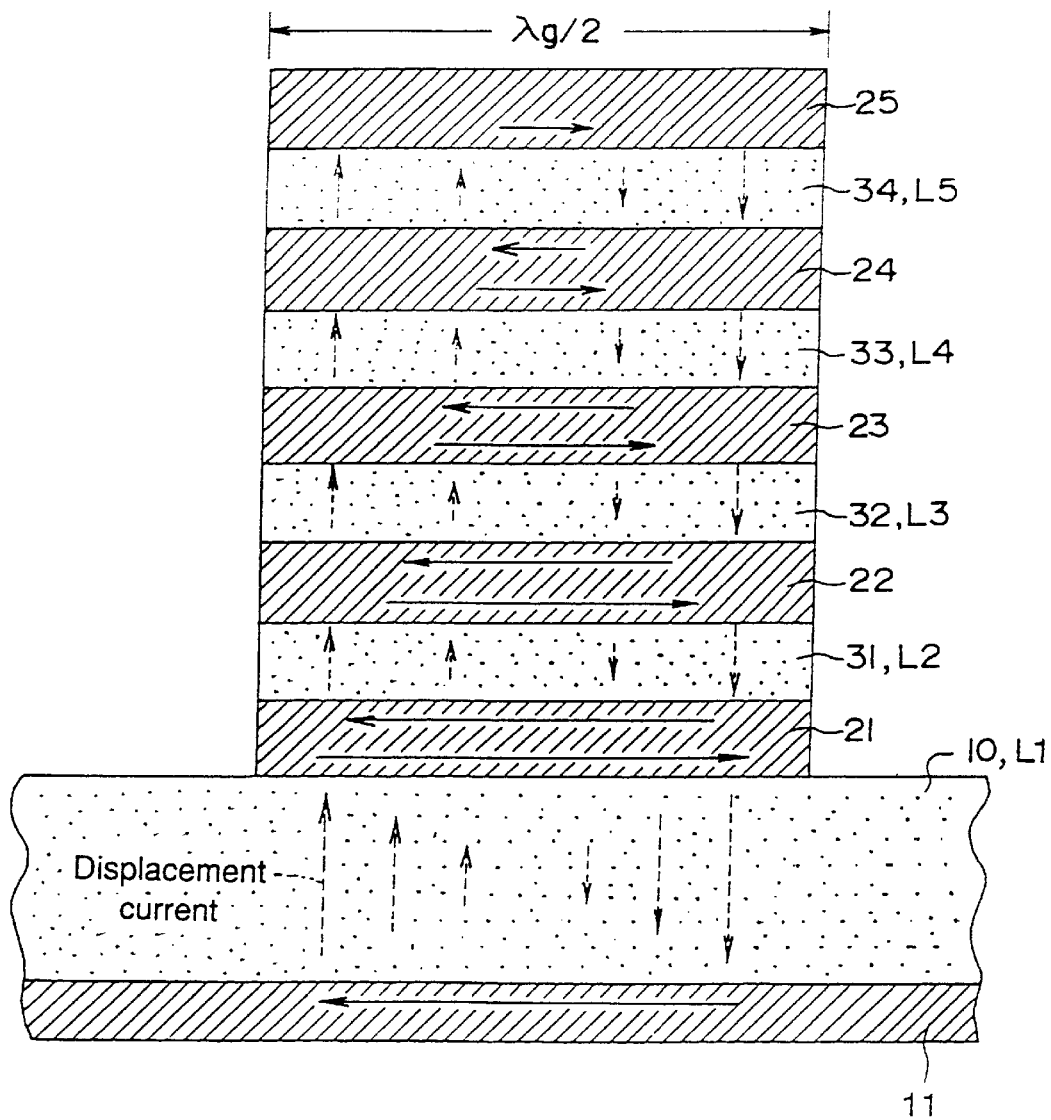
FIG. 21 is a schematic longitudinal sectional view of the half-wavelength line type resonator of FIG. 1 in the longitudinal direction, showing an operation thereof.

FIG. 21 is a schematic longitudinal sectional view of the half-wavelength line type resonator of FIG. 1 in the longitudinal direction, showing its operation, where it is reduced in scale in the longitudinal direction remarkably greater than in the direction of thickness thereof. In FIG. 21, the high frequency current is indicated by solid lines and the displacement current is indicated by dotted lines.

When the resonator is excited by a high frequency signal inputted to the main transmission line L1, as shown in FIG. 21, the thin film conductors 21 to 25 transmit a part of the high frequency power, which is incident onto the thin film conductors via the thin film dielectrics on the lower side thereof, onto the side thin film conductors on the upper side, and while reflecting a part of the energy of the high frequency signal to the thin film conductors on the lower side via the thin film dielectrics on the lower side. Further, within the thin film dielectrics 31 to 34 sandwiched by the adjacent two thin film conductors, the reflection waves and the transmission waves resonate to each other, while two high frequency currents facing each other in opposite directions (hereinafter, referred to as facing two high frequency currents) flow in the vicinity of the upper surfaces and in the vicinity of the lower surfaces of each of the thin film conductors 21 to 25. That is, since the film thickness of each of the thin film conductors 21 to 25 is smaller than the skin depth δo, the two high frequency currents in opposite directions interfere with each other via the thin film dielectrics, and then are cancelled by each other except some remaining portions thereof. On the other hand, the displacement currents are generated by electromagnetic fields in the thin film dielectrics 31 to 34, and this leads to high frequency currents on the surfaces of the adjacent thin film conductors. In the half-wavelength line type resonator, as shown in FIG. 21, the displacement currents become the maximum at the longitudinal both ends of the line and become the minimum at the center of the line.

Figure 11:
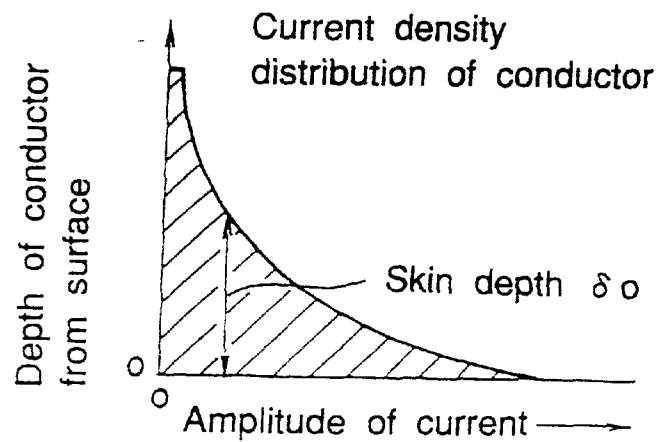
FIG. 11 shows a current density distribution of the conductors through which a high frequency wave has been transmitted.
Figure 12:
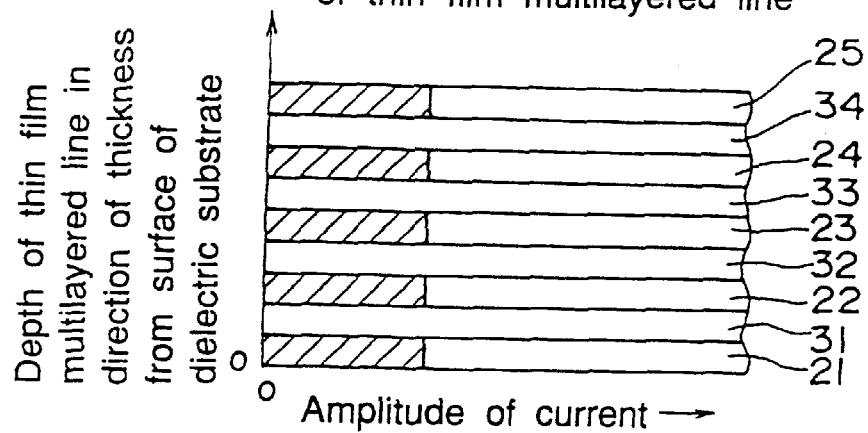
FIG. 12 shows an ideal current density distribution of the thin film multilayered transmission line of FIG. 1 through which a high frequency wave has been transmitted.
Figure 13:
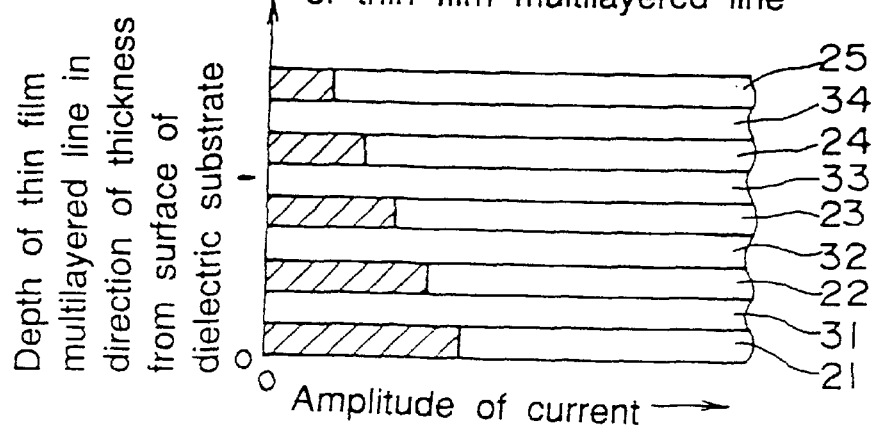
FIG. 13 shows an actual current density distribution of the thin film multilayered transmission line of FIG. 1 through which a high frequency wave has been transmitted.

In this case, if the case is ideal, the amplitudes of the high frequency currents of the thin film conductors 21 to 25 becomes constant, and then, the conductor loss becomes the theoretical possible minimum, as shown in FIG. 12. However, in an actual case, the amplitudes of the high frequency currents of the thin film conductors 21 to 25 have distributions different from each other as shown in FIG. 13, and when the upper the thin film conductor is, the more the amplitudes of the high frequency currents decreases. It is noted that in all of FIGS. 11, 12, and 13, the total current values proportional to the area of hatched portions are made coincident with one another for comparison.

Further, since the film thickness $\Delta x_s$ and the dielectric constant $\epsilon_s$ for determining the effective dielectric constant of each of the thin film dielectrics 31 to 34 are so set that the phase velocities of the TEM waves propagating through the transmission lines L1 to L5 are made substantially equal to one another, the high frequency currents flowing through the thin film conductors 21 to 25 are substantially in phase to one another. Then, the high frequency currents flowing through the thin film conductors 21 to 25 in phase cause the skin depth δo to increase effectively.

Accordingly, if the resonator is excited by a high frequency signal, the high frequency electromagnetic field energy transfers to the upper transmission lines by the coupling between the electromagnetic fields of the adjacent transmission lines, while propagating in the longitudinal direction of the transmission lines of the resonator. In this case, the resonator is brought into a resonance state, since the TEM waves propagate with an effectively greater skin depth δo, i.e. a smaller surface resistance $R_s$, and reflect at the both ends of the half-wavelength line.

Figure 28:
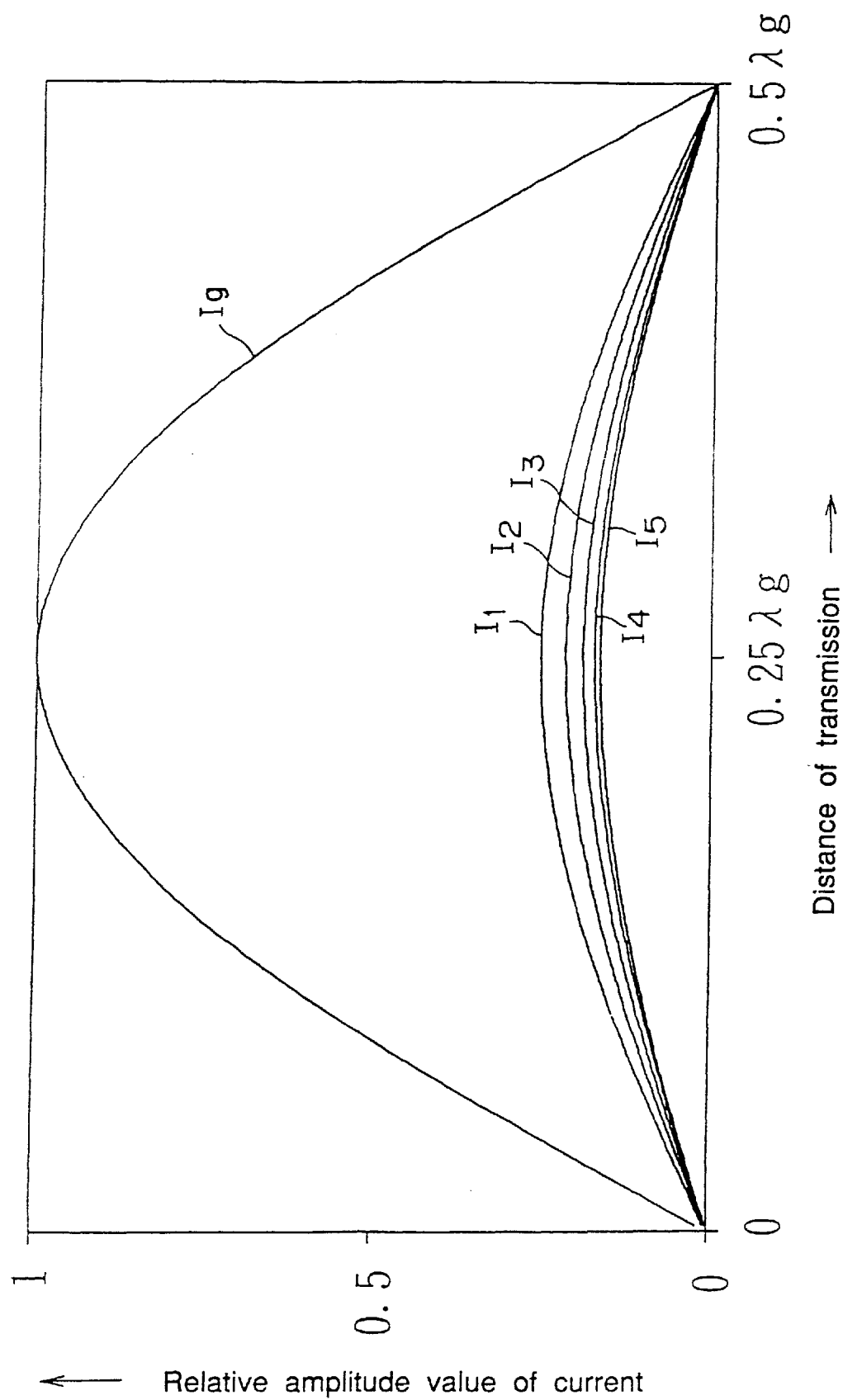
FIG. 28 is a graph showing a relative amplitude of a current flowing through each of the thin film conductors 21 to 25 and the earth conductor 11 relative to the distance of transmission of the half-wavelength line type resonator of FIG. 1.

FIG. 28 is a graph showing relative amplitudes of currents flowing through the thin film conductors 21 to 25 and the earth conductor 11 relative to the distance of transmission of the half-wavelength line type resonator of FIG. 1. In this case, the parameters for the present simulation were set as follows:

(a) the relative dielectric constant (effective value) $\epsilon_{mr}$ of the dielectric substrate 10=8.85, (b) the substrate thickness $\Delta x_m$ of the dielectric substrate 10=330 μm, (c) the relative dielectric constant $\epsilon_{sr}$ of each of the thin film dielectrics 31 to 34=3.80, (d) the electric conductivity σ of each of the thin film conductors 21 to 25=5.18×10$^7$ S/m (material: Cu), (e) the film thickness $\Delta \xi$ of each of the thin film conductors 21 to 25=0.97 μm, (f) the electric conductivity a of the earth conductor 11=5.18×10$^7$ S/m (material: Cu), (g) the film thickness $\Delta \xi_m$ of the earth conductor 11=10.00 μm, (h) (the width of each of the thin film conductors 21 to 25)=(width of each of the thin film dielectrics 31 to 34)=(the width of the dielectric substrate 10)=(the width of the earth conductor 11)=5.00 mm, (i) the film thickness $\Delta x_s$ of each of the thin film dielectrics 31 to 34=0.73 μm, and (j) the line length L=25.1333 mm.

In FIG. 28, Ig and I1, I2, I3, I4 and I5 denote the relative amplitudes of the currents flowing through the earth conductor 11 and the thin film conductors 21 to 25, respectively. As apparent from FIG. 28, the currents flowing through the earth conductor 11 and the thin film conductors 21 to 25 are divided and shunt with predetermined rates, constituting respective standing waves.

Therefore, the resonator of the present embodiment has the following characteristic advantages:

(a) since the thin film multilayered electrode is provided, the skin depth can be effectively increased, so that the conductor loss and the surface resistance can be reduced substantially as compared with the conventional counterpart. This makes it possible to offer a resonator or filter with an extremely large no-loaded Q in smaller size and weight; and (b) in the case of a microstrip line, for example, a line impedance can be changed without changing the line width, by using a thin film multilayered transmission line or not using it, or by changing the number of the multilayered layers. This facilitates pattern design on the dielectric substrate.

According to the simulation by the present inventor, it can be seen that a decreasing rate of the surface resistance Rs is in inverse proportion to the number n of multilayered layers in the ideal case of FIG. 12. On the other hand, in the actual case of FIG. 13, it can be seen that the decreasing rate of the surface resistance Rs is in inverse proportion to the square root of the number n of the multilayered layers.

Figure 27:
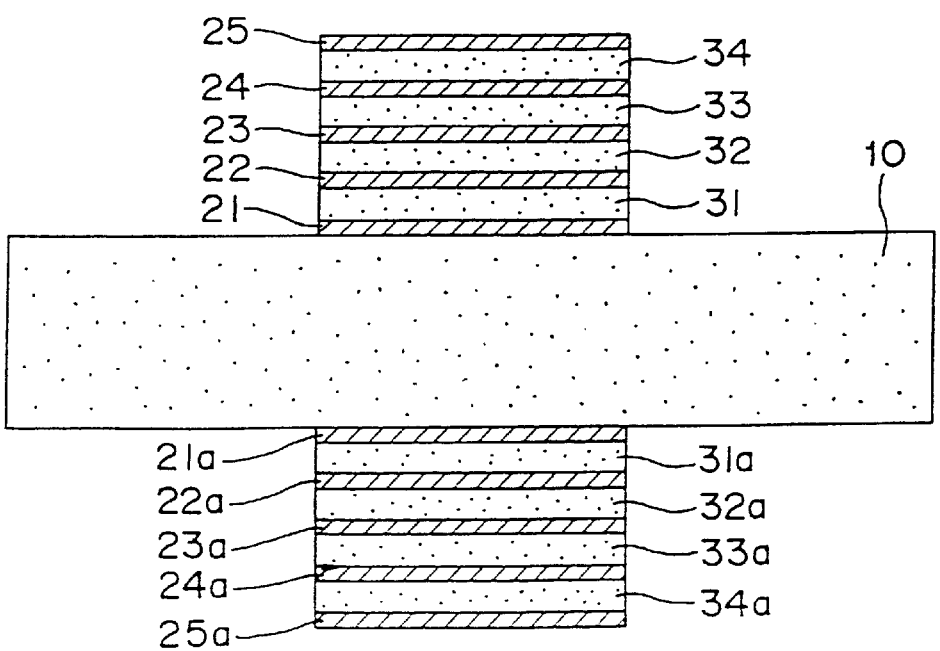
FIG. 27 is a sectional view of a modified embodiment using a thin film multilayered transmission line as an earth conductor in the half-wavelength line type resonator using an electromagnetic field coupled type thin film multilayered transmission line which is a first embodiment of the present invention.

It may be constituted so that only the earth conductor 11 of the first embodiment have the structure of the above-mentioned high frequency electromagnetic field coupled type thin film multilayered electrode, and the remaining conductors have the known conventional structures. Alternatively, the earth conductor 11 may be provided so as to be have the structure of the above-mentioned high frequency electromagnetic field coupled type thin film multilayered electrode in a manner as shown in FIG. 27. As shown in FIG. 27, a thin film conductor 21a, a thin film dielectric 31a, a thin film conductor 22a, a thin film dielectric 32a, a thin film conductor 23a, a thin film dielectric 33a, a thin film conductor 24a, a thin film dielectric 34a, and a thin film conductor 25a are multilayered in this order on the rear surface of the dielectric substrate 10. In this case, an operation of the resonator shown in FIG. 27 is similar to that of the resonator shown in FIG. 1. Further, a protection dielectric may be formed on the thin film conductor 25 of the top layer of the first embodiment, and on a thin film conductor 25a of an embodiment modified from the first embodiment. Further, the entire body of the resonator may be enclosed or covered by a protection dielectric.

In the first embodiment described hereinabove, the main transmission line L1 and the sub-transmission lines L2 to L5 are the microstrip lines. However, the present invention is not limited to this, and they may also be transmission lines such as tri-plate type strip lines, coplanar lines, slot lines or the like. In this case, thin film multilayered conductors according to the present invention may be used for at least either one of the center conductor and the earth conductor.

In the above-mentioned first embodiment, the film thickness $\Delta x_s$ and the dielectric constant $\epsilon_s$ of each of the thin film dielectrics 31 to 34 are set so that the phase velocities of the TEM waves propagating through the transmission lines L1 to L5 are made substantially equal to one another. However, the present invention is not limited to this, but it may alternatively be arranged so that the phase velocities of the TEM waves propagating through the main transmission line L1 and at least one of the sub-transmission lines L2 to L5 are made substantially equal to each other. Further, it may also be arranged so that only at least one of the sub-transmission lines L2 to L5 is provided.

Also, in the above first embodiment, the film thickness $\Delta \xi$ of each of the thin film conductors 21 to 25 is so set that the electromagnetic fields are coupled with each other between the adjacent transmission lines L1 and L2, L2 and L3, L3 and L4, and L4 and L5. However, the present invention is not limited to this, and it may alternatively be arranged so that the electromagnetic fields are coupled with each other between the main transmission line L1 and at least one of the sub-transmission lines L2 to L5.

Further, in the above-mentioned first embodiment, the main transmission line L1 is the TEM mode transmission line. However, the present invention is not limited to this, and the main transmission line L1 may also be a transmission line for propagating therethrough electromagnetic waves of the other kind of mode such as a TE mode, a TM mode, or the like.

In the above-mentioned first embodiment, the filter using the half-wavelength line type resonator using the electromagnetic field coupled type thin film multilayered transmission line is described. However, the present invention is not limited to this, and a filter using a quarter-wavelength line type resonator using an electromagnetic field coupled type thin film multilayered transmission line may be constituted. Furthermore, by coupling an input transmission line with the electromagnetic field coupled type thin film multilayered transmission line, and coupling an output transmission line with the electromagnetic field coupled type thin film multilayered transmission line, respectively, via relatively strong electromagnetic couplings, the electromagnetic field coupled type thin film multilayered transmission line can be used as a transmission line having an extremely low loss. Simulation results of the electromagnetic field coupled type thin film multilayered transmission line will be described hereinafter.

Figure 25:
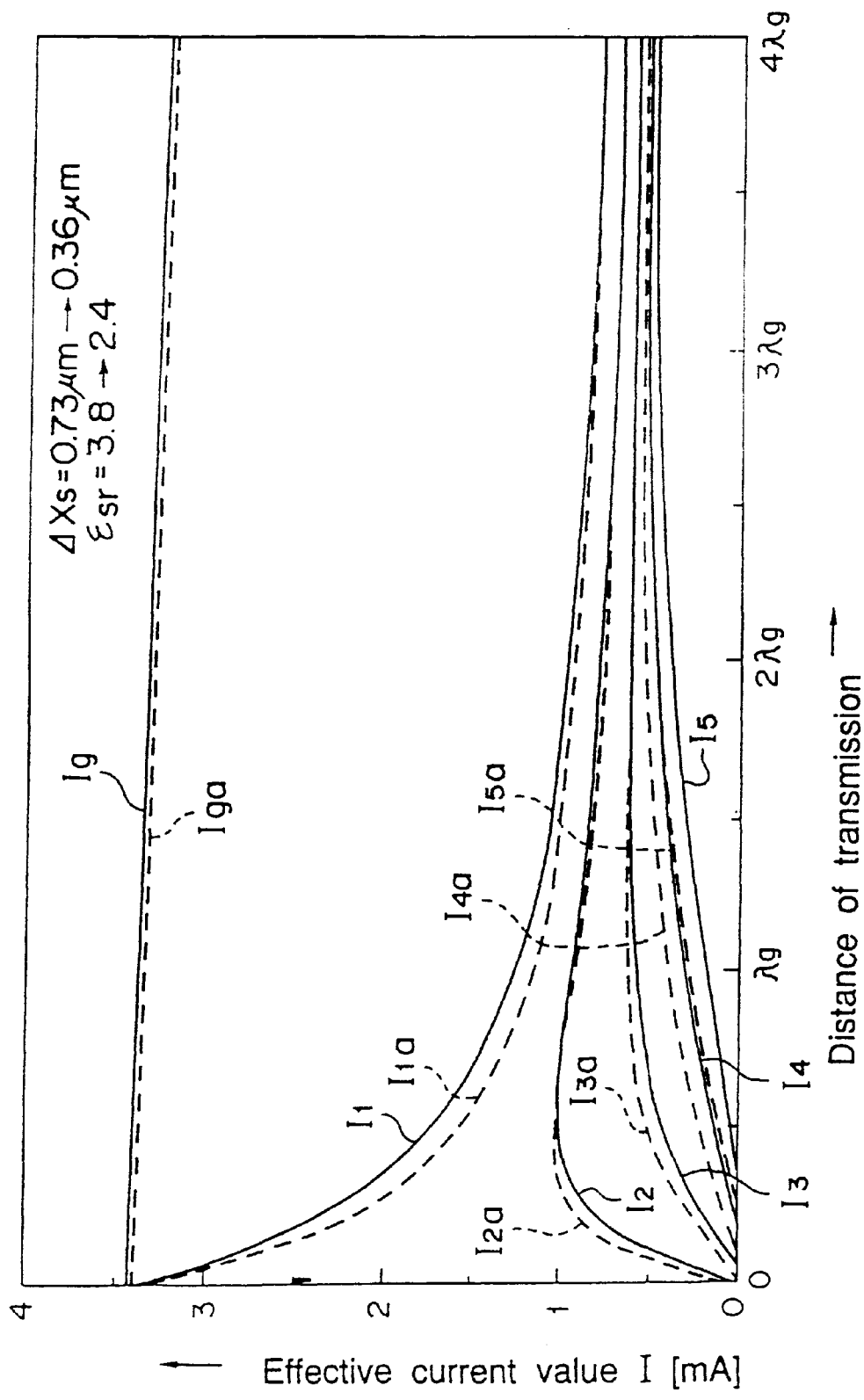
FIG. 25 is a graph showing an effective current value of a current flowing through each of the thin film conductors and the earth conductor relative to a distance of transmission in the case where a film thickness $\Delta x_s$ of the thin film dielectrics is made to be smaller in the thin film multilayered transmission line according to the present invention.
Figure 26:
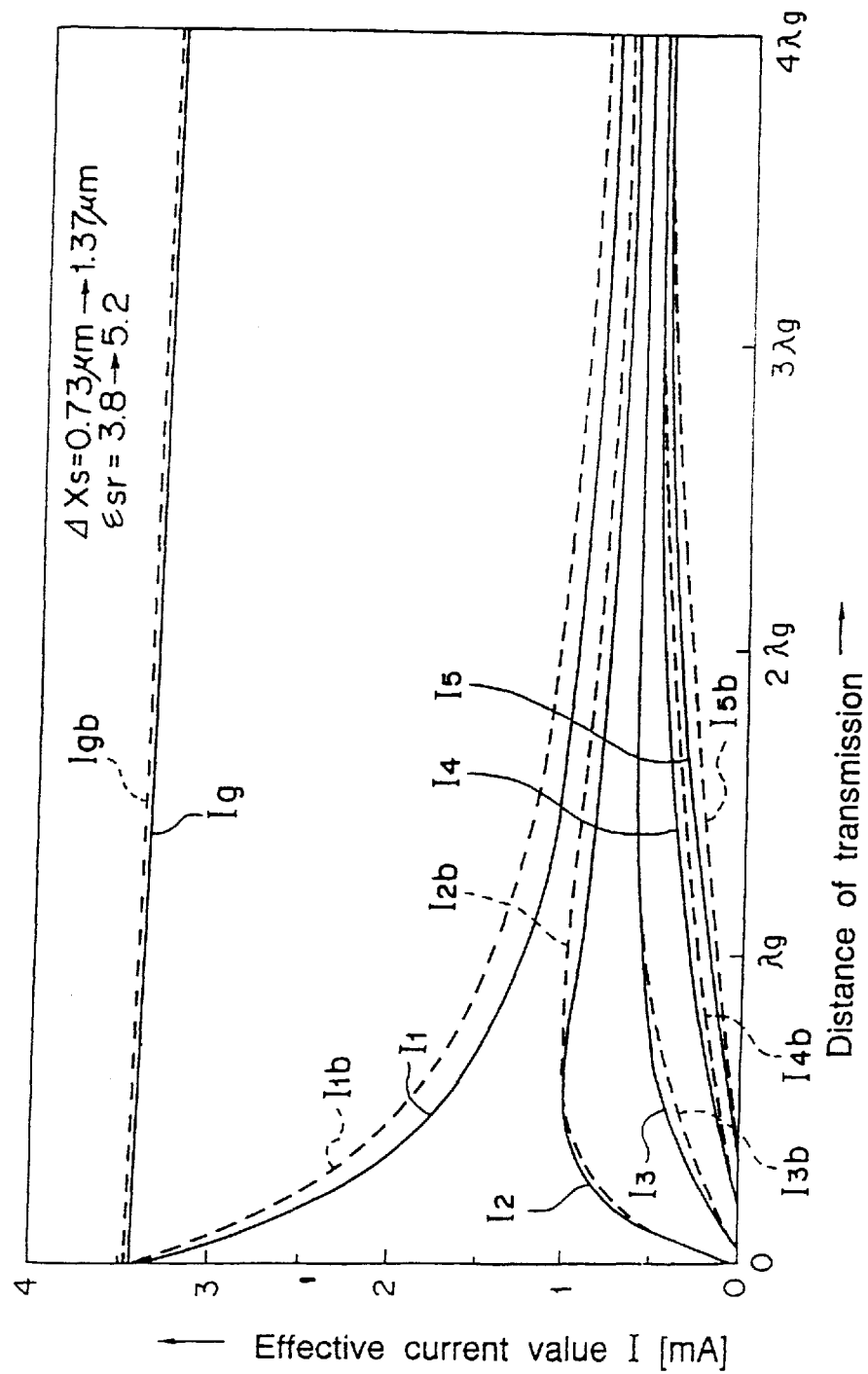
FIG. 26 is a graph showing an effective current value of a current flowing through each of the thin film conductors and the earth conductor relative to a distance of transmission in the case where the film thickness $\Delta x_s$ of the thin film dielectrics is made to be greater in the thin film multilayered transmission line according to the present invention.

FIG. 25 is a graph showing effective current values of currents flowing through the thin film conductors 21 to 25 and the earth conductor 11 relative to a distance of transmission from the input terminal in the case where the film thickness $\Delta x_s$ of each of the thin film dielectrics 31 to 34 is decreased from 0.73 $\mu$m to 0.36 $\mu$m in the thin film multilayered transmission line according to the present invention, and FIG. 26 is a graph showing effective current values of currents flowing through the thin film conductors 21 to 25 and the earth conductor 11 relative to a distance of transmission from the input terminal in the case where the film thickness $\Delta x_s$ of each of the thin film dielectrics 31 to 34 is increased from 0.73 $\mu$m to 1.37 $\mu$m in a thin film multilayered transmission line according to the present invention. In the above cases, the parameters for the present simulation were set as follows:

(a) the relative dielectric constant $\epsilon_{mr}$ of the dielectric substrate 10 (effective value)=8.85, (b) the substrate thickness $\Delta x_m$ of the dielectric substrate 10=330 $\mu$m, (c) the electric conductivity a of each of the thin film conductors 21 to 25=5.18×10$^7$ S/m (material: Cu), (d) the film thickness $\Delta \xi$ of each of the thin film conductors 21 to 25=0.97 $\mu$m, (e) the electric conductivity a of the earth conductor 11=5.18×10$^7$ S/m (material: Cu), (f) the film thickness $\Delta \xi_m$ of the earth conductor 11=10.00 $\mu$m, (g) (the width of the thin film conductors 21 to 25)=(the width of the thin film dielectrics 31 to 34)=(the width of the dielectric substrate 10)=(the width of the earth conductor 11)=5.00 mm, and (h) the input transmission power=0.1 mW=−10 dBm.

In FIGS. 25 and 26, Ig, $I_1$, $I_2$, $I_3$, $I_4$ and $I_5$ are effective current values of currents flowing through respectively the earth conductor 11 and the thin film conductors 21 to 25 when the dielectric constant $\epsilon_{sr}$ of each of the thin film dielectrics 31 to 34 is 3.8 and their film thickness $\Delta x_s$ is 0.73 $\mu$m. In FIG. 25, Iga, $I_1$a, $I_2$a, $I_3$a, $I_4$a and $I_5$a are effective current values of currents flowing through respectively the earth conductor 11 and the thin film conductors 21 to 25 when the dielectric constant $\epsilon_{sr}$ of each of the thin film dielectrics 31 to 34 is 2.4 and their film thickness $\Delta x_s$ is 0.36 $\mu$m. Further, in FIG. 26, Igb, $I_1$b, $I_2$b, $I_3$b, $I_4$b and $I_5$b are effective current values of currents flowing through respectively the earth conductor 11 and the thin film conductors 21 to 25 when the dielectric constant $\epsilon_{sr}$ of each of the thin film dielectrics 31 to 34 is 5.2 and their film thickness $\Delta x_s$ is 1.37 $\mu$m.

As apparent from FIGS. 25 and 26, only the main transmission line L1 is excited at the input terminal, and a current also permeates or flows to the sub-transmission lines L2 to L5 as the microwave signal propagates. Then the current value of the current flowing through each of the transmission lines L1 to L5 becomes constant when the signal propagates from the input terminal by about four wavelengths. It can be understood that a power of about 99.5% of the total transmission power is transmitted to the main transmission line L1 in the present model, while the other remaining transmission power is distributed into the sub-transmission lines L2 to L5. Further, by comparing FIG. 25 with FIG. 26, it can be understood that a distance of convergence of the permeating current is reduced by thinning the film thickness $\Delta x_s$ of each of the thin film dielectrics 31 to 34. That is, by thinning the film thickness $\Delta x_s$ of each of the thin film dielectrics 31 to 34, the current immediately or suddenly permeates in the vicinity of the input terminal. When FIG. 4 is regarded as a transmission line, a reduced conversion loss results in the connection or coupling between the input or output terminal and the multi-layer transmission line.

Second Embodiment

Figure 16:
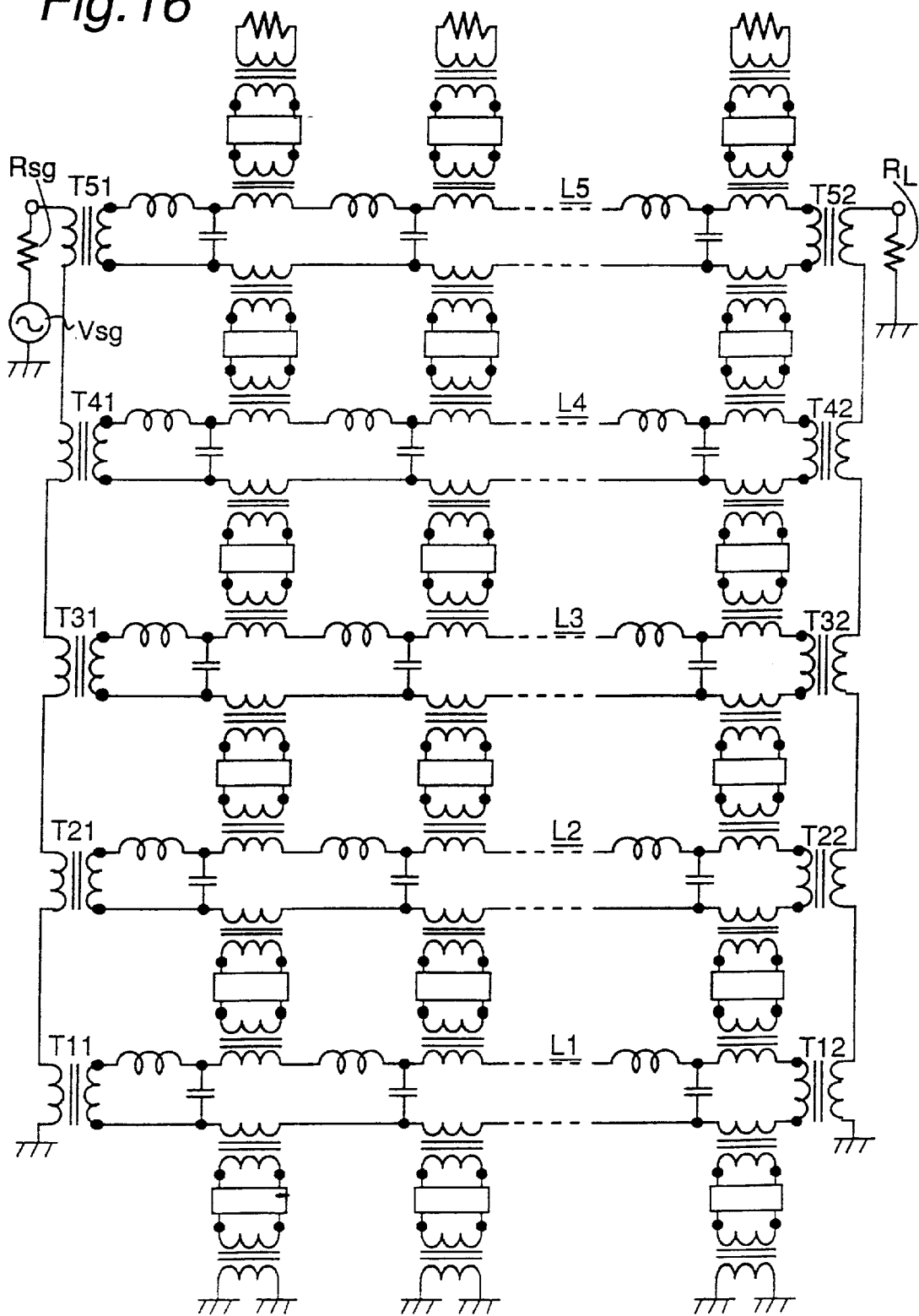
FIG. 16 is a circuit diagram showing an equivalent circuit of a half-wavelength line type resonator filter using an electromagnetic field coupled type thin film multilayered transmission line which is a second embodiment according to the present invention.

FIG. 16 is a circuit diagram showing an equivalent circuit of a half-wavelength line type resonator filter using an electromagnetic field coupled type thin film multilayered transmission line which is a second embodiment according to the present invention.

Although only the main transmission line L1 is excited in the above-mentioned first embodiment, it may also be arranged so that all the transmission lines L1 to L5 are excited in a manner similar to that of the second embodiment. Hereinbelow, only differences from the first embodiment will be described.

As shown in FIG. 16, respective primary turns of ideal transformers T11, T21, T31, T41 and T51 respectively connected to the transmission lines L1, L2, L3, L4 and L5 are connected in series, and a series circuit of a signal generator Vsg and its internal resistance Rsg is connected across both the ends of the primary turns connected in series. On the other hand, respective secondary turns of ideal transformers T12, T22, T32, T42 and T52 on the opposite end side are connected in series, and a load resistance $R_L$ is connected across both the ends of the secondary turns connected in series.

Figure 17:
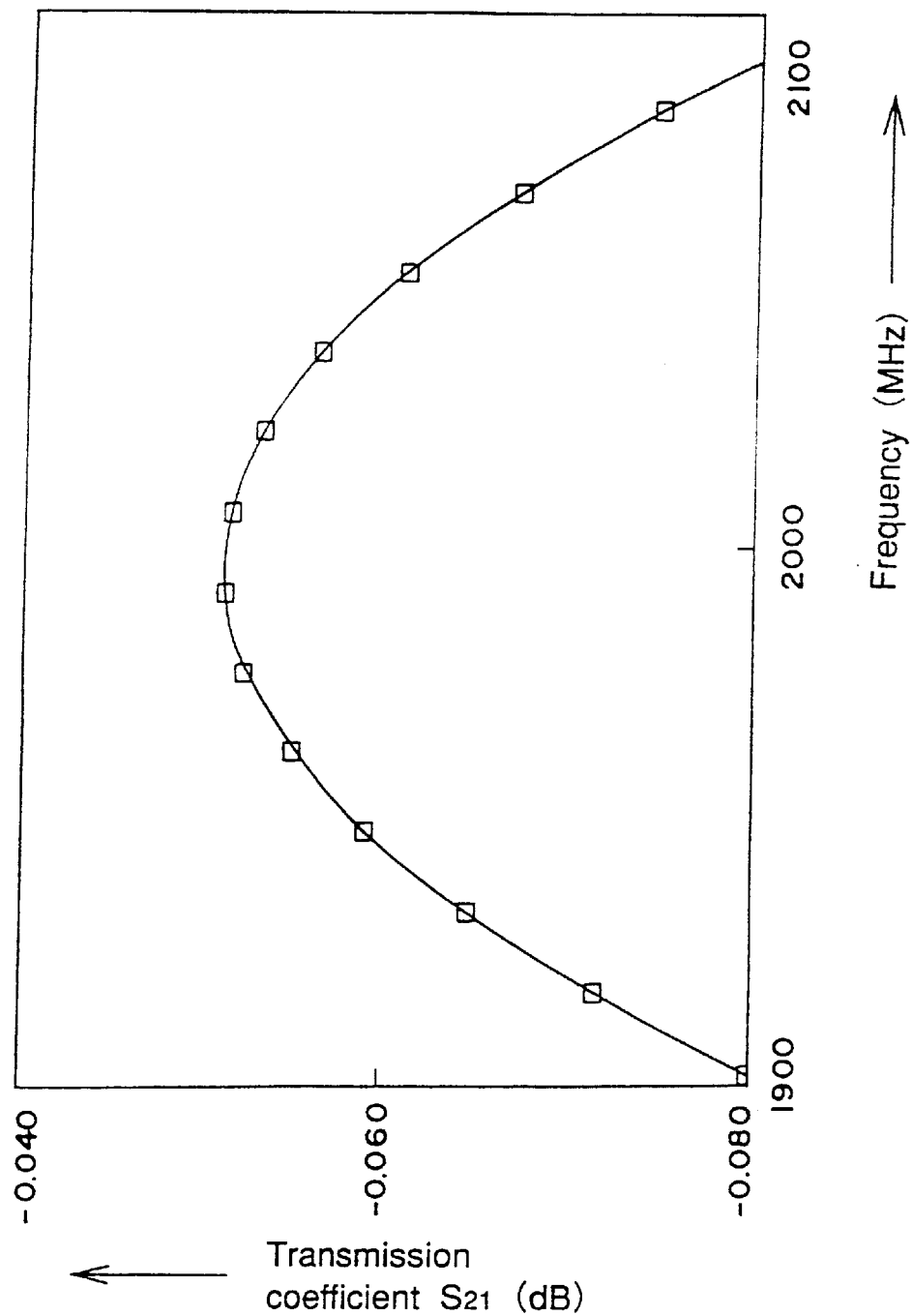
FIG. 17 is a graph showing frequency characteristic of a transmission coefficient $S_{21}$, which is a simulation result of the half-wavelength line type resonator of FIG. 16.

FIG. 17 is a graph showing frequency characteristic of a transmission coefficient $S_{21}$, which is a simulation result of the half-wavelength line type resonator of FIG. 16. In this case, the parameters for the present simulation were set in the same way as that in FIG. 5.

As understood from FIG. 17, a resonance characteristic having a transmission coefficient $S_{21}$=approximately −0.050 dB was obtained at a center frequency of 2000 MHz.

In the above-mentioned second embodiment, it may alternatively be arranged so that the transmission lines L1 to L5 are excited to be weighted by using a variable amplifier or a variable attenuator, and an in-phase divider. In this case, distribution of electromagnetic field energies propagating in the transmission lines L1 to L5 can be changed.

Third Embodiment

Figure 18:
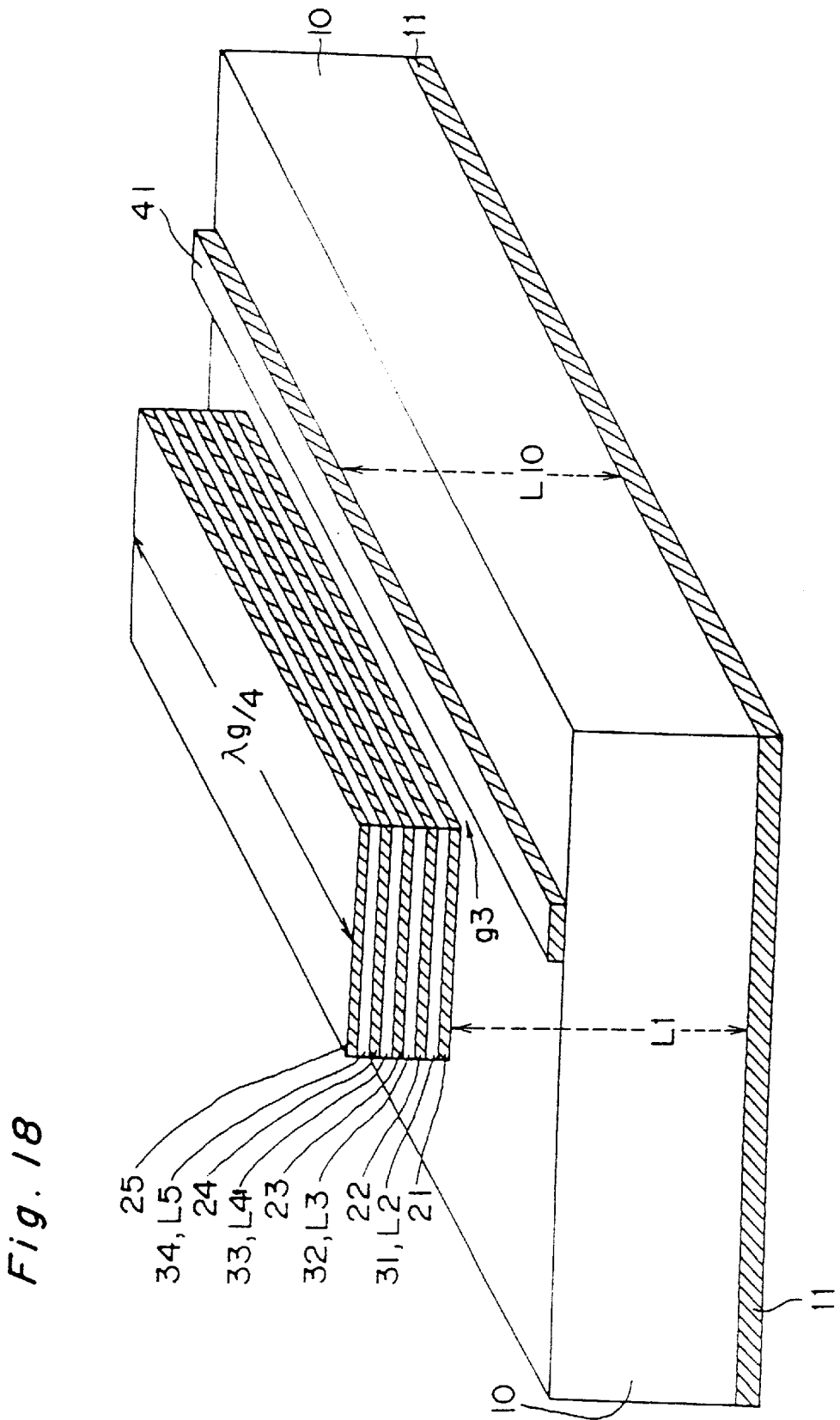
FIG. 18 is a perspective view of a quarter-wavelength line type band-elimination filter using an electromagnetic field coupled type thin film multilayered transmission line which is a third embodiment according to the present invention.

FIG. 18 is a perspective view of a quarter-wavelength line type band-elimination filter using an electromagnetic field coupled type thin film multilayered transmission line which is a third embodiment according to the present invention.

In the third embodiment, as shown in FIG. 18, a microstrip line L10 is formed by forming a microstrip conductor 41 on a dielectric substrate 10 having an earth conductor 11 formed on its entire rear surface. Then, the thin film multilayered electrode of the first embodiment comprising the thin film conductors 21 to 25 and the thin film dielectrics 31 to 34 and having a length of ¼ λg is formed so that the lowest thin film conductor 21 is positioned a gap g3 away from and close to the microstrip conductor 41 of the microstrip line L10 enough to be electromagnetically coupled therewith, and that the longitudinal directions of the thin film conductors 21 to 25 and the thin film dielectrics 31 to 34 are parallel to the longitudinal direction of the microstrip conductor 41.

Figure 19:
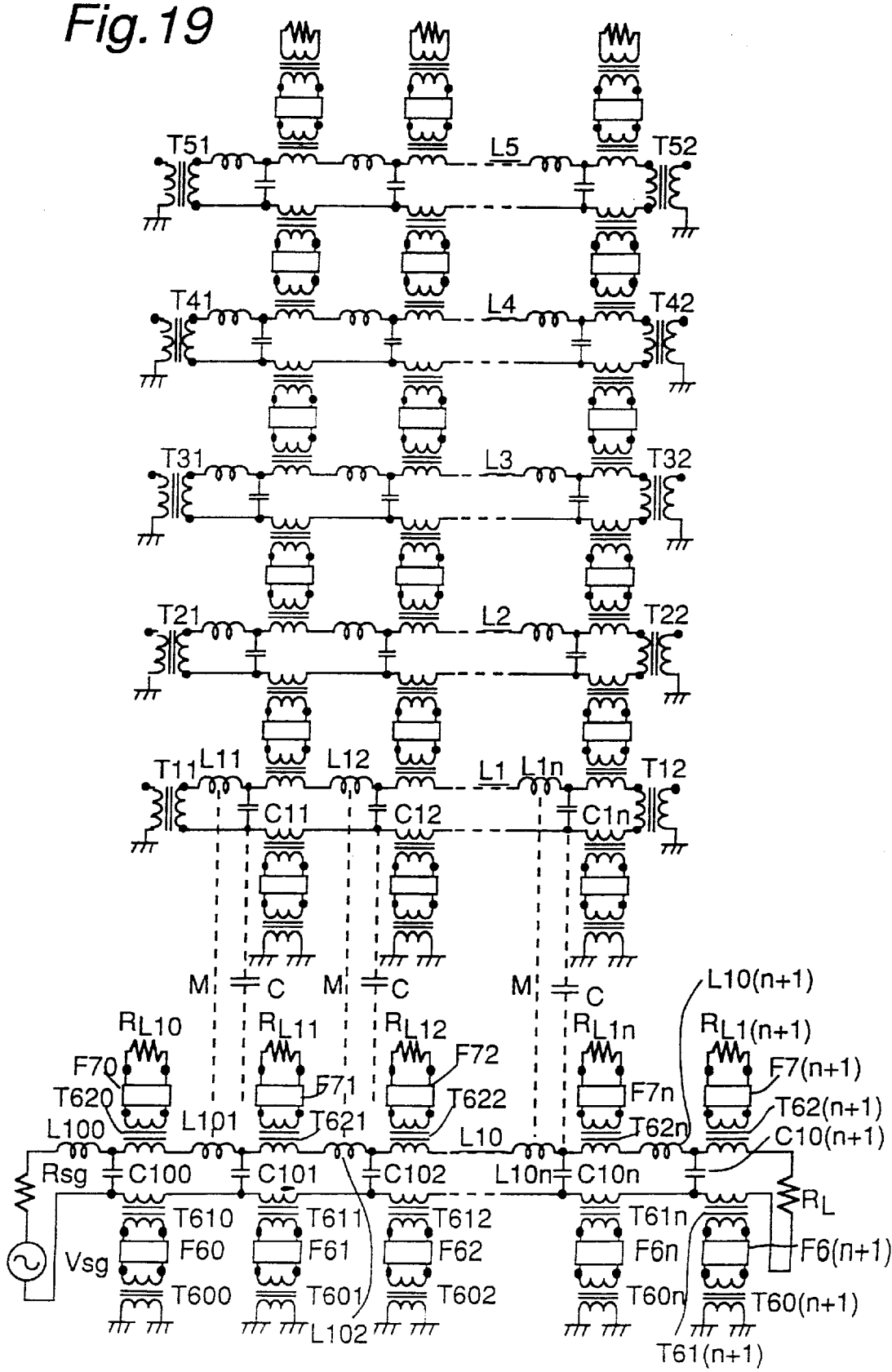
FIG. 19 is a circuit diagram including an equivalent circuit of the quarter-wavelength line type band-elimination filter of FIG. 18.

FIG. 19 is a circuit diagram including an equivalent circuit of the quarter-wavelength line type band-elimination filter of FIG. 18.

As shown in FIG. 19, the microstrip line L10 is made up of a distributed constant circuit in which LC unit distributed constant circuits are connected in series and which comprises inductors L100, L101, . . . , L10n, L10 (n+1) and capacitors C100, C101, . . . , C10n, C10 (n+1). A resonator-exciting signal generator Vsg and its internal resistance Rsg are connected to one end of the microstrip line L10, while a load resistance $R_L$ is connected to another end of the microstrip line L10. In the main microstrip line L10, ideal transformers T610, T611, T612, . . . , T61n, T61 (n+1) are inserted so as to be connected to the lower line in the figure between the unit distributed constant circuits. The ideal transformers T610, T611, . . . , T61n, T61(n+1) are grounded via four-terminal circuits F60, F61, . . . , F6n, F6(n+1) each of which comprises a distributed constant circuit corresponding to the earth conductor 11 and including a loss resistance and via ideal transformers T600, T601, T602, . . . , T60n, T60 (n+1).

Also, in the microstrip line L10, ideal transformers T620, T621, T622, . . . , T62n, T62 (n+1) are inserted so as to be connected to the upper line in the figure between the unit distributed constant circuits. The ideal transformers T620, T621, . . . , T62n, T62(n+1) are connected to load resistances $R_{L10}$, $R_{L11}$, $R_{L2}$, . . . , $R_{L1n}$, $R_{L1}$ (n+1), respectively, via the microstrip conductor 41 and four-terminal circuits F70, F71, F72, . . . , F7n, F7 (n+1) corresponding to the space positioned above the microstrip conductor 41.

Further, inductive coupling and capacitive coupling is generated by the gap g3 as follows. That is, the inductors L11 and L101 are inductively coupled (M) with each other, the inductors L12 and L102 are inductively coupled (M) with each other, and the following goes likewise, so that the inductors L1n and L10 are inductively coupled (M) with each other. Also, the capacitors C11 and C101 are capacitively coupled (C) with each other, the capacitors C12 and C102 are capacitively coupled (C) with each other, and the following goes likewise, so that the capacitors C1n and C10n are capacitively coupled (C) with each other.

In the circuit arranged as described above, a resonator with an extremely small conductor loss can be provided by the quarter-wavelength line type thin film multilayered transmission line. Accordingly, by forming a microstrip line L10 which is electromagnetically coupled with the resonator, a quarter-wavelength line type band-elimination filter having an extremely large no-loaded Q can be provided.

Although the microstrip line L10 is used in the above-mentioned third embodiment, the present invention is not limited to this. It may be replaced with the other kind of transmission line such as a coplanar line, a slot line, a tri-plate type strip line, or the like.

Modified Embodiment

Further, in modified embodiments as described below, use of an electromagnetic field coupled type thin film multilayered electrode according to the present invention makes it possible to reduce the surface resistance of the electrode remarkably as compared with the conventional counterpart, and this results in that the transmission loss can be remarkably reduced.

Figure 20:
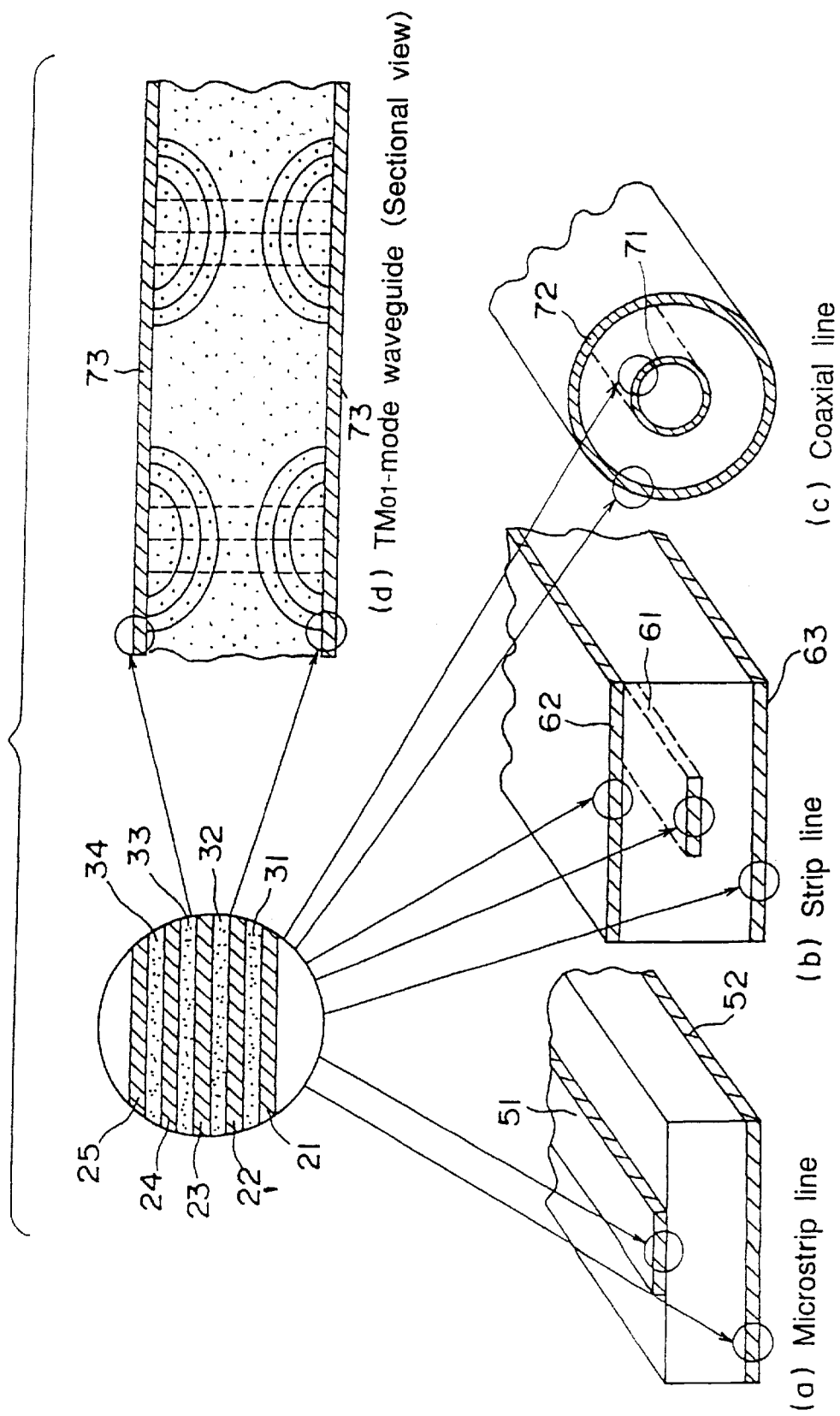

FIG. 20(a) is a perspective view of a microstrip line using the electromagnetic field coupled type thin film multilayered electrode according to the present invention, and the electromagnetic field coupled type thin film multilayered electrode is used for a microstrip conductor 51 and an earth conductor 52 of the microstrip line. It is noted that the electromagnetic field coupled type thin film multilayered electrode may be used only for the microstrip conductor 51, and the electromagnetic field coupled type thin film multilayered electrode may be used only for the earth conductor 52.

Also, FIG. 20(b) is a perspective view of a tri-plate type strip line using the electromagnetic field coupled type thin film multilayered electrode according to the present invention, and the electromagnetic field coupled type thin film multilayered electrode is used for a microstrip conductor 61 and earth conductors 62 and 63 of the above-mentioned strip line. It is noted that the electromagnetic field coupled type thin film multilayered electrode may be used only for the microstrip conductor 61, and the electromagnetic field coupled type thin film multilayered electrode may be used only for at least one of the earth conductors 62 and 63.

Further, FIG. 20(c) is a perspective view of a coaxial line using the electromagnetic field coupled type thin film multilayered electrode according to the present invention, and the electromagnetic field coupled type thin film multilayered electrode is used for a center conductor 71 and an earth conductor 72 of the above-mentioned coaxial line. It is noted that the electromagnetic field coupled type thin film multilayered electrode may be used only for the center conductor 71, and the electromagnetic field coupled type thin film multilayered electrode may be used only for the earth conductor 72.

Still further, FIG. 20(d) is a longitudinal sectional view of a $TM_{01}$ mode circular waveguide using the electromagnetic field coupled type thin film multilayered electrode 73 according to the present invention, and the electromagnetic field coupled type thin film multilayered electrode is used for an outer-surface electrode of the circular waveguide. Further, the electromagnetic field coupled type thin film multilayered electrode may be used for an outer-surface electrode of a rectangular waveguide (not shown).

Further, the electromagnetic field coupled type thin film multilayered electrode according to the present invention can be applied to electrode-film portions formed on the outer surface of a cavity in a TM mode single mode type dielectric resonator in which a core dielectric and the cavity are integrally formed so as to be molded, such as disclosed in, for example, the Japanese Patent Laid-Open Publication No. HEISEI 03 (1991)-292006 (the Japanese Patent Application No. HEISEI 02 (1990)-094862). Also, the TM mode dielectric resonator is not limited to the TM mode single mode type, and the electromagnetic field coupled type thin film multilayered electrode can also be applied to a double mode type dielectric resonator (for example, see FIG. 23) such as disclosed in, for example, the Japanese Patent Laid-Open Publication No. SHOWA 63 (1988)-313901 (the Japanese Patent Application No. SHOWA 62 (1987)-150021), and can be further applied to a triple mode type dielectric resonator such as disclosed in, for example, the Japanese Patent Laid-Open Publication No. SHOWA 61 (1986)-157101 (the Japanese Patent Application No. SHOWA 59 (1984)-279203). That is, irrespectively of the number of modes used, the electromagnetic field coupled type thin film multilayered electrode according to the present invention can be applied to an electrode-film portion of TM mode dielectric resonators.

Figure 23:
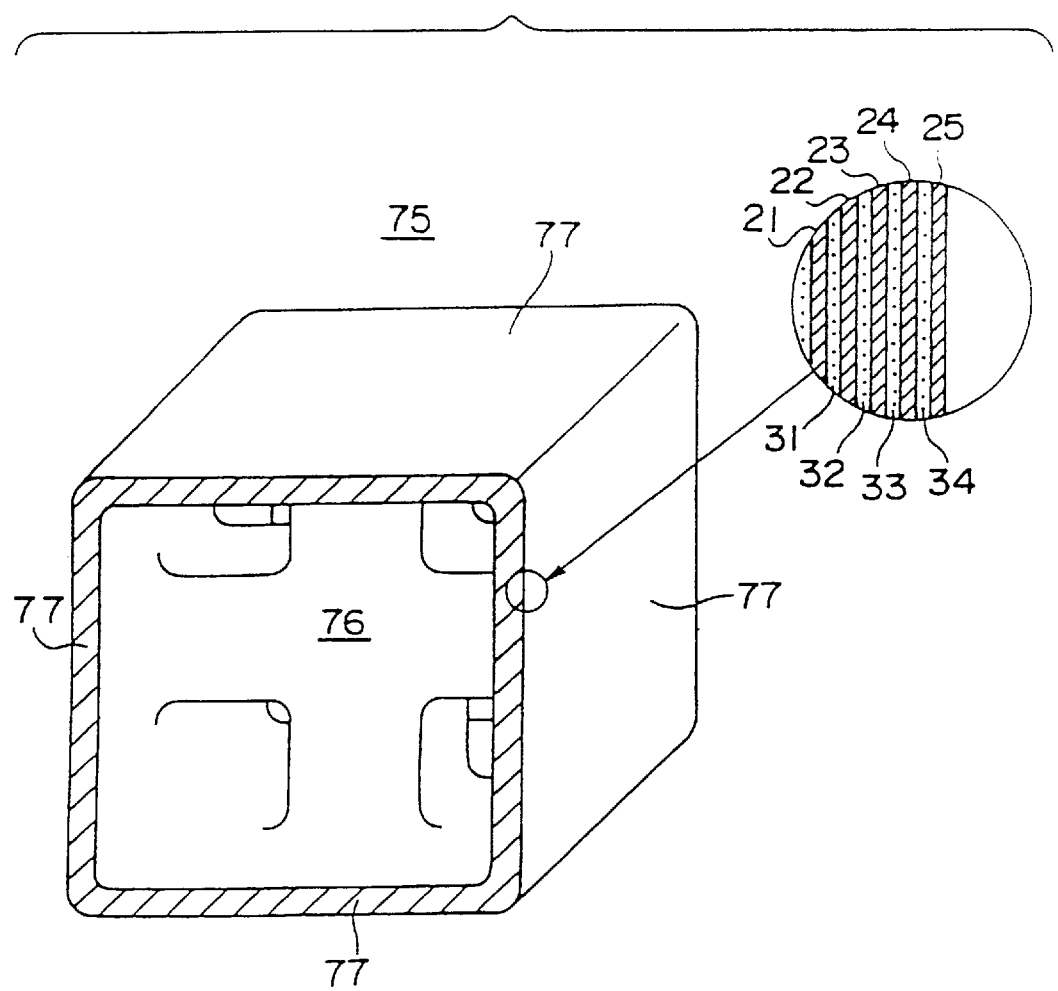
FIG. 23 is a perspective view showing a $TM_{110}$ double mode type dielectric resonator of a modified embodiment.

FIG. 23 shows an example of a double mode type dielectric resonator 75 which is a modified embodiment of the present invention. The double mode type dielectric resonator 75 is built up in such a way that at a center portion within a square-cylindrical resonator casing 77 in which the outer surface of the dielectric has been metallized, a cross-shaped dielectric 76 formed integrally so as to be molded with the casing 77 is provided. In this case, the electrode of the resonator casing 77 is provided by using the electromagnetic field coupled type thin film multilayered electrode according to the present invention. This results in that the surface resistance of the electrode can be remarkably reduced, and then, the loss of the dielectric resonator can be reduced while its no-loaded Q can be increased.

Figure 24:
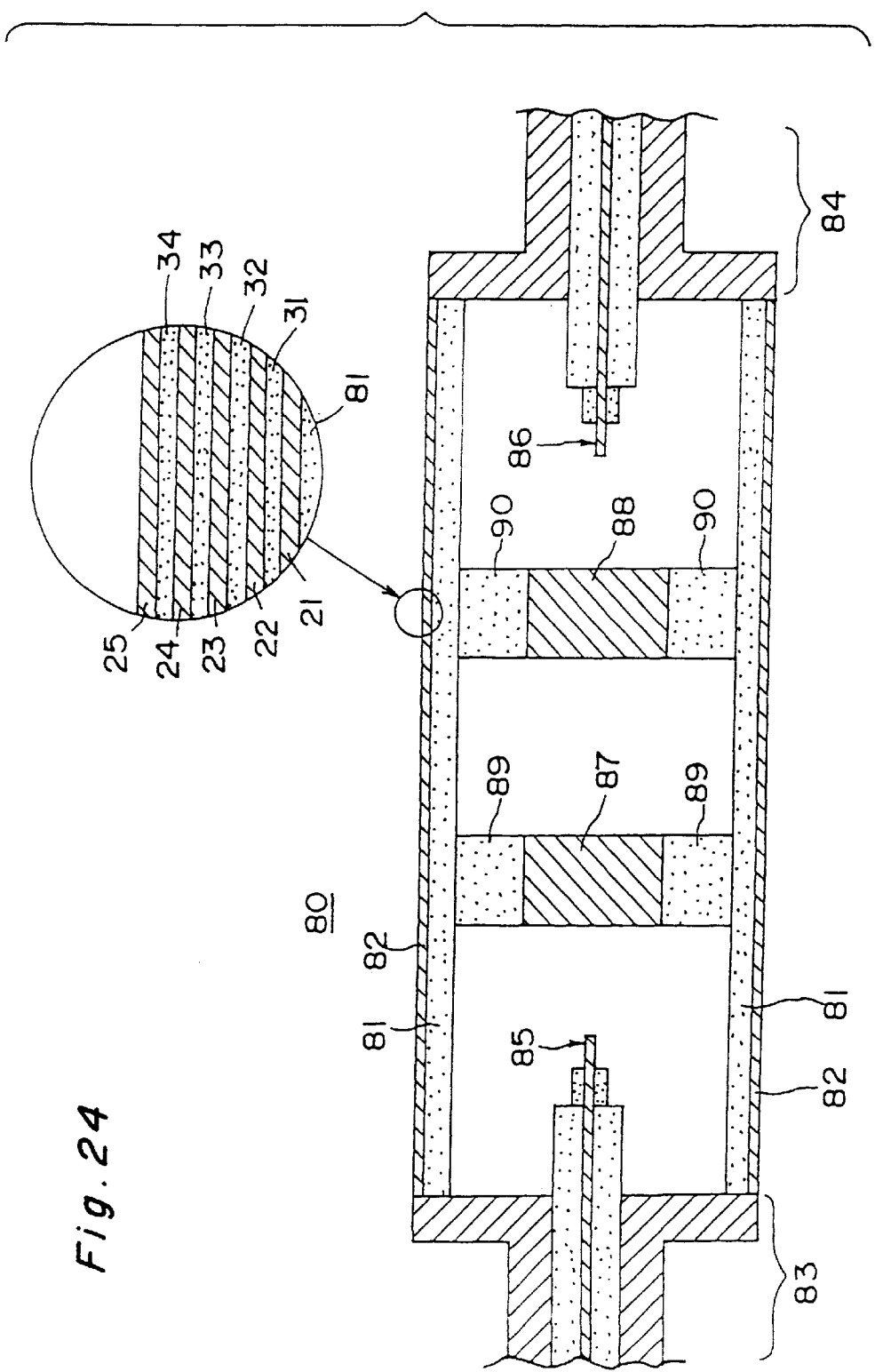
FIG. 24 is a longitudinal sectional view showing a $TM_{01\delta}$ mode type two-stage dielectric band-pass filter of a modified embodiment.

FIG. 24 shows an example of a $TM_{01\delta}$ mode type two-stage dielectric band-pass filter 80 which is a modified embodiment of the present invention. The band-pass filter 80 is made up in the following way. That is, SMA connectors 83 and 84 for input and output are attached at both ends of a cylindrical dielectric waveguide 81 having an outer-peripheral electrode 82. The earth conductors of the SMA connectors 83 and 84 are connected to the outer-peripheral electrode 82, while monopole antennas 85 and 86 opposed to each other within the dielectric waveguide 81 are connected to center conductors of the SMA connectors 83 and 84, respectively. Within the dielectric waveguide 81 between the monopole antennas 85 and 86, two circular-cylindrical dielectric resonators 87 and 88 are provided a predetermined interval away from each other and via ring-shaped dielectric supports 89 and 90 in internal connection with the inner peripheral surface of the dielectric waveguide 81. Also in the band-pass filter 80, the outer-peripheral electrode 82 is provided by the use of the electromagnetic field coupled type thin film multilayered electrode according to the present invention. This allows the surface resistance of the outer-peripheral electrode 82 to be remarkably reduced so that the loss of the dielectric filter can be reduced while its no-loaded Q can be increased.

Further, the electromagnetic field coupled type thin film multilayered electrode according to the present invention can be applied to electrodes of various types of high frequency devices intended for their respective specific high frequency operations such as those of isolators, antennas, inductors such as chip coils, capacitors or the like.

In the above-mentioned embodiments, the solid thin film dielectrics 31 to 34 are used, however, the present invention is not limited to this, and gas such as air or liquid may be substituted for the thin film dielectrics 31 to 34.

In the above-mentioned embodiments, the thin film dielectrics 31 to 34 have the same film thickness, however, the present invention is not limited to this, and the respective film thicknesses of the thin film dielectrics 31 to 34 may be set to be different from each other.

In the above-mentioned embodiments, the thin film conductors 21 to 24 have the same film thickness, however, the present invention is not limited to this, and the respective film thicknesses of the thin film conductors 21 to 24 may be set to be different from each other.

In the above-mentioned embodiments, the earth conductor 11 and the thin film conductors 21 to 25 are made of a conductor having an electric conductivity such as Cu, Ag, Au or the like, however, the present invention is not limited to this, and as at least one material of the earth conductor 11 and the thin film conductors 21 to 25, there may be used any of the following superconductors:

(a) a pure metal superconducting material such as Nb, Pb, or the like;

(b) a superconducting material of an alloy such as an Nb—Ti alloy, an Nb—Zr alloy, or the like;

(c) an intermetallic compound superconducting material such as $Nb_3Sn$, $V_3Si$ or the like; and (d) a ceramic group oxide superconducting material exemplified by:

(d-1) $La_{2-x}Ba_xCuO_{4-\delta}$ or $La_{2-x}Sr_xCuO_{4-\delta}$ such as $La_{1.85}Sr_{0.15}CuO_4$ or the like;

(d-2) $YBa_2Cu_3O_{7-\delta}$ (amount of oxygen deficiency $\delta=0$ to 1) such as $YBa_2Cu_3O_7$ or the like;

(d-3) a Bi—Sr—Ca—Cu—O group, the Bi—Sr—Ca—Cu—O group superconducting material being obtained by temporarily baking a powder of a mixture of $Bi_2O_3$, $SrCO_3$, $CaCO_3$ and CuO at a temperature of 800 to 870° C. and thereafter sintering the powder in an atmosphere at a temperature of 850 to 880° C.;

(d-4) a Tl—Ba—Ca—Cu—O group, the Tl—Ba—Ca—Cu—O group superconducting material being obtained as a superconducting material having a main component of $Tl_2CaBa_2Cu_2O_x$ by mixing and shaping powders of $Tl_2O_3$, CaO, BaO and CuO and thereafter sealingly inserting the shaped mixture of the powders in a silica tube including an oxygen gas at one atmospheric pressure and heating the same at a temperature of 880° C. for three hours;

(d-5) an EBCO group; and (d-6) a BPSCCO group;

(e) an organic substance superconducting material exemplified by:

(e-1) a tetramethyltetraselenafulvalene (TMTSF) superconducting material such as $(TMTSF)_2ClO_4$ or the like;

(e-2) a bis(ethylenedithiolo)tetrathiafulvalene (BEDT-TTF) superconducting material such as β(BEDT-TTF)$_2$I$_3$ or the like; and (e-3) a dmit group superconducting material.

INDUSTRIAL APPLICABILITY

As described above, according to the present invention, there is provided a thin film multilayered electrode in which thin film conductors (21–25) and thin film dielectrics (31–34) are alternately multilayered so that a plurality of TEM mode transmission lines (L2–L5) are stacked or multilayered, the TEM mode transmission lines (L2–L5) each comprising a pair of the thin film conductors (21 and 22, 22 and 23, 23 and 24, and 24 and 25) between which each of the thin film dielectrics (31–34) is sandwiched, wherein, based on a number (n) of multilayered layers of said thin film conductors (21–25) and said thin film dielectrics (31–34), the film thickness of each of said thin film dielectrics (31–34) is set so that phase velocities of TEM waves which propagate through at least two of the plurality of TEM mode transmission lines (L2–L5) are made substantially equal to each other, and wherein, based on the number (n) of multilayered layers of said thin film conductors (21–25) and said thin film dielectrics (31–34), the film thickness of each of the thin film conductors (21–25) is made smaller than the skin depth of a frequency used so that electromagnetic fields of at least two of the plurality of TEM mode transmission lines (L2–L5) are coupled with each other. Accordingly, the skin depth is effectively increased, and then, the conductor loss and the surface resistance can be reduced remarkably as compared with those of the conventional counterpart, while remarkably preventing the external dimensions from increasing as compared with the conventional structure. Further, since the above-mentioned respective film thicknesses are set based on the number (n) of multilayered layers, even though the number of (n) of multilayered layers is increased, the above-mentioned loss reduction effect can not deteriorate or can not disappear. Use of the thin film multilayered electrode of the present invention makes it possible to offer high frequency transmission lines with smaller transmission loss, high frequency resonators or high frequency filters each having an extremely large no-loaded Q, or high frequency devices each having smaller size and weight.

What is claimed is:

1. A high frequency electromagnetic field coupled type thin film multilayered electrode, comprising:

a plurality of layers of thin film conductors and a plurality of layers of thin film dielectrics alternately stacked to provide a plurality of microwave transmission lines, said microwave transmission lines each comprising a respective pair of said thin film conductors between which corresponding ones of said thin film dielectrics are sandwiched, wherein a respective film thickness of each of said thin film conductors is set so as to be smaller than a skin depth at a predetermined frequency, wherein, based on a number (n) of layers of said thin film conductors and said thin film dielectrics, the respective film thickness of each of said thin film dielectrics is set so that, at the predetermined frequency, respective phase velocities of microwaves which propagate through at least two of said plurality of microwave transmission lines are substantially equal to each other, and wherein, based on the number (n) of layers of said thin film conductors and said thin film dielectrics, the respective film thickness of each of said thin film conductors is set so that electromagnetic fields of at least two of said plurality of microwave transmission lines are coupled with each other and currents flowing in respective ones of said thin film conductors are substantially equal to each other.

2. The high frequency electromagnetic field coupled type thin film multilayered electrode as claimed in claim 1, wherein each of said thin film conductors is comprised of a respective superconducting material.

3. A dielectric resonator comprising:

a resonator casing including a conductor; and a dielectric having a predetermined shape, said dielectric being placed within said resonator casing wherein said conductor is formed of said high frequency electromagnetic field coupled type thin film multilayered electrode as claimed in claim 1 or 2.

4. A high frequency filter comprising:

the dielectric resonator as claimed in claim 3;

an input terminal for inputting said high frequency signal to said dielectric resonator, said input terminal electromagnetically coupled with said dielectric resonator and an output terminal for outputting said high frequency signal from said dielectric resonator, said output terminal electromagnetically coupled with said dielectric resonator.

5. A high frequency transmission line comprising:

a first transmission line; and at least one microwave second transmission line in which at least a pair of thin film conductor layers and at least one thin film dielectric layer are alternately stacked to provide said microwave second transmission line comprising said at least a pair of said thin film conductor layers between which said at least one thin film dielectric layer is sandwiched, wherein, a respective film thickness of each of said thin film conductors is set so as to be smaller than a skin depth at a predetermined frequency;

wherein, based on the number (n) of layers of said thin film conductor layers and said thin film dielectric layers, the respective film thickness of each of said thin film dielectric layers is set so that, at the predetermined frequency, a respective phase velocity of a microwave which propagates through said first transmission line and a phase velocity of a microwave which propagates through at least one of said second transmission lines are substantially equal to each other, and wherein, based on the number (n) of layers of said thin film conductor layers and said thin film dielectric layers, the respective film thickness of each of said thin film conductor layers is set so that an electromagnetic field of said first transmission line and an electromagnetic field of at least one of said second transmission lines are coupled with each other and currents flowing in respective ones of said thin film conductors are substantially equal to each other.

6. The high frequency transmission line as claimed in claim 5, wherein an effective dielectric constant of each of said thin film dielectrics constituting said second transmission lines is made smaller than an effective dielectric constant of said dielectric constituting said first transmission line.

7. The high frequency transmission line as claimed in claim 5, wherein a thickness of said thin film dielectric constituting said second transmission line is made smaller than a thickness of said dielectric constituting said first transmission line.

8. The high frequency transmission line as claimed in claim 5, wherein said high frequency transmission line is a microstrip line.

9. The high frequency transmission line as claimed in claim 8, wherein said microstrip line comprises said second transmission line provided as a microstrip conductor on a first surface of a dielectric substrate, and an earth conductor provided on a second surface of said dielectric substrate.

10. The high frequency transmission line as claimed in claim 8, wherein said microstrip line comprises said one second transmission line provided as a microstrip conductor on a first surface of a dielectric substrate, and second transmission line provided as an earth conductor on a second surface of said dielectric substrate.

11. The high frequency transmission line as claimed in claim 5, wherein said high frequency transmission line is a strip line.

12. The high frequency transmission line as claimed in claim 5, wherein said high frequency transmission line is a coaxial line.

13. A high frequency transmission line having at least one conductor, said conductor comprising a thin film multi-layered electrode having a plurality of layers of thin film conductors and a plurality of layers of thin film dielectrics alternately stacked to provide a plurality of microwave transmission lines, each of said microwave transmission lines comprising a respective pair of said thin film conductors between which corresponding ones of said thin film dielectrics are sandwiched, wherein, a respective film thickness of each of said thin film conductors is set so as to be smaller than a skin depth at a predetermined frequency, wherein, based on a number (n) of layers of said thin film conductors and said thin film dielectrics, the respective film thickness of each of said thin film dielectrics is set so that, at the predetermined frequency, respective phase velocities of microwaves which propagate through at least two of said plurality of microwave transmission lines are substantially equal to each other, and wherein, based on the number (n) of pairs of said thin film conductors and said thin film dielectrics, the respective film thickness of each of said thin film conductors is set so that electromagnetic fields of at least two of said plurality of microwave transmission lines are coupled with each other and currents flowing in respective ones of said thin film conductors are substantially equal to each other.

14. The high frequency transmission line as claimed in claim 13, wherein said high frequency transmission line is a waveguide.

15. The high frequency transmission line as claimed in claim 13, wherein at least one of said thin film conductors is comprised of a respective superconducting material.

16. A high frequency resonator comprising said high frequency transmission line as claimed in any one of claims 3 or 5, wherein said high frequency transmission line has a length equal to a half of a guide wavelength of a signal transmitted through said high frequency transmission line, in a direction in which said signal is transmitted.

17. A high frequency resonator comprising said high frequency transmission line as claimed in any one of claims 3 or 5, wherein said high frequency transmission line has a length equal to a quarter of a guide wavelength of a signal transmitted through said high frequency transmission line, in a direction in which said signal is transmitted.

18. A high frequency band-elimination filter comprising:

a transmission line for inputting a high frequency signal at one end thereof and outputting said high frequency signal at another end thereof; and the high frequency resonator as claimed in claim 17 to be coupled with said transmission line, wherein said high frequency signal is said signal of said high frequency transmission line of said high frequency resonator.

19. A high frequency filter comprising:

the high frequency resonator as claimed in claim 17, said high frequency resonator having said predetermined length;

an input terminal for inputting said signal to said high frequency resonator; and an output terminal for outputting said signal from said high frequency resonator.

20. A high frequency device having an electrode perform a predetermined high frequency operation, wherein said electrode comprises a high frequency electromagnetic field coupled type thin film multilayered electrode in which a plurality of layers of thin film conductors and a plurality of layers of thin film dielectrics are alternatively stacked to provide a plurality of microwave transmission lines, said microwave transmission lines each comprising a respective pair of said thin film conductors between which corresponding ones of said thin film dielectrics are sandwiched, wherein a respective film thickness of each of said thin film conductors is set so as to be smaller than a skin depth at a predetermined frequency, wherein, based on (a) a number (n) of layers of said thin film conductors and said thin film dielectrics, and (b) the skin depth of the predetermined frequency, a respective film thickness of each of said thin film dielectrics is set so that respective phase velocities of microwaves which propagate through at least two of said plurality of microwave transmission lines are substantially equal to each other, and wherein, based on (a) the number (n) of layers of said thin film conductors and said thin film dielectrics, and (b) the skin depth of the predetermined frequency, respective film thickness of each of said thin film conductors is set so that electromagnetic fields of at least two of said plurality of microwave transmission lines are coupled with each other, and currents flowing in respective ones of said thin film conductors are substantially equal to each other.

* * * * *